United States Patent
Garcia et al.

(10) Patent No.: US 12,041,424 B2
(45) Date of Patent: Jul. 16, 2024

(54) REAL-TIME ADAPTATION OF AUDIO PLAYBACK

(71) Applicant: Google LLC, Mountain View, CA (US)

(72) Inventors: Ricardo Antonio Garcia, Mountain View, CA (US); Gustav David Gunnar Sennton, London (GB); Bich Ha Lo, London (GB); Nicholas James Clark, London (GB); Nicole Laure McWilliams, London (GB); Richard Ledley, London (GB); Alex Florescu, Hampton (GB); Jamie Garside, London (GB)

(73) Assignee: Google LLC, Mountain View, CA (US)

( * ) Notice: Subject to any disclaimer, the term of this patent is extended or adjusted under 35 U.S.C. 154(b) by 119 days.

(21) Appl. No.: 17/654,538

(22) Filed: Mar. 11, 2022

(65) Prior Publication Data

US 2022/0295204 A1 Sep. 15, 2022

Related U.S. Application Data

(60) Provisional application No. 63/159,810, filed on Mar. 11, 2021.

(51) Int. Cl.
*H04R 29/00* (2006.01)
*G06N 20/00* (2019.01)
*H03G 5/16* (2006.01)

(52) U.S. Cl.
CPC .......... *H04R 29/001* (2013.01); *G06N 20/00* (2019.01); *H03G 5/165* (2013.01); *H04R 29/008* (2013.01)

(58) Field of Classification Search
CPC .......... H04S 7/301; H04S 7/305; H04S 7/307; H04S 7/302; H04S 2400/11; H04S 7/308;
(Continued)

(56) References Cited

U.S. PATENT DOCUMENTS 8,234,395 B2 7/2012 Millington
9,690,539 B2 6/2017 Sheen
(Continued)

OTHER PUBLICATIONS

Horaczek, "The new Sonos Roam speaker is built to go anywhere—including the shower", http://www.popsci.com/story/technology/sonos-roam-waterproof-portable-speaker, published Mar. 9, 2021 (retrieved Feb. 15, 2022).

(Continued)

*Primary Examiner* — Norman Yu
(74) *Attorney, Agent, or Firm* — McDonnell Boehnen Hulbert & Berghoff LLP

(57) ABSTRACT

A method includes determining one or more audio characteristics of a first digital signal representing a first portion of streaming media content provided by a media playback application to an audio output component; playing the first portion of the media content into an environment; capturing, by an audio output component, a second digital signal representing the first portion of the media content as played; determining, based on the captured second digital signal, one or more detected audio characteristics of the media content as played into the environment; determining a difference between the one or more audio characteristics of the media content and the one or more detected audio characteristics; calibrating a second portion of the media content based on the difference and based on a determination that the second portion is to be calibrated; and playing, by the audio output component into the environment, the second portion as calibrated.

30 Claims, 10 Drawing Sheets

(58) Field of Classification Search
CPC .... H04S 2420/01; H04S 2400/01; H04S 7/00; H04S 7/30; H04S 7/303; H04S 2400/15; H04R 29/001; H04R 5/02; H04R 2227/007; H04R 29/00; H04R 29/008; G06N 20/00; H03G 5/165
USPC ........ 381/56, 58, 57, 98, 303, 59, 94.2, 103, 381/101, 102, 107, 320, 61, 71.11
See application file for complete search history.

(56) References Cited

U.S. PATENT DOCUMENTS

| | | | |
|---|---|---|---|
| 10,034,116 B2 | 7/2018 | Kadri | |
| 2003/0002688 A1* | 1/2003 | Kanevsky | H04R 3/00 381/384 |
| 2013/0051561 A1* | 2/2013 | Ozawa | H04R 1/1041 381/17 |
| 2016/0011850 A1* | 1/2016 | Sheen | G06F 3/162 715/709 |
| 2016/0212535 A1* | 7/2016 | Le Nerriec | H04R 27/00 |
| 2017/0041724 A1* | 2/2017 | Master | H04R 29/002 |
| 2017/0289717 A1* | 10/2017 | Little | G06F 3/165 |
| 2017/0289718 A1* | 10/2017 | Jarvis | H04S 7/40 |
| 2019/0073192 A1 | 3/2019 | Sheen | |
| 2019/0342689 A1 | 11/2019 | Garcia | |
| 2020/0221240 A1* | 7/2020 | Pye | H03G 5/165 |
| 2021/0110812 A1* | 4/2021 | Naylor-Teece | G10L 15/30 |

OTHER PUBLICATIONS

Li, "Google working on environmental EQ adjustments for Pixel phones with 'Adaptive Sound'", https://9to5google.com/2020/12/1/google-pixel-adaptive-sound, published Dec. 1, 2020 (retrieved Dec. 2, 2020).

Welch, "Google's latest Pixel feature drop adds even more battery optimizations and Adaptive Sound", https://www.theverge.com/2020/12/7/22158452/google-pixel-december-feature-drop-features, Dec. 7, 2020 (retrieved Feb. 7, 2022).

Potts, "Pixel phones might be getting a major upgrade in speaker audio quality", https://www.androidpolice.com/2020/12/01/pixel-phones-might-be-getting-a-major-upgrade-in-speaker-audio-quality, published Dec. 1, 2020 (retrieved Dec. 2, 2020).

Davies, "Sonos Move Hands-On: $399 Bluetooth Speaker Cuts All Cords", https_www.slashgear.com/?url=https%3A%2F%2Fwww.slashgear.com%2Fsonons-move-hands-on-399-bluetooth-speaker-cuts-all-cords-05589 . . . , published Sep. 5, 2019 (retrieved Mar. 8, 2022).

Davies, "Sonos Move Review: Cutting Cords Not Corners", https_www.slashgear.com/?url=https%3A%2F%2Fwww.slashgear.com%2Fsonons-move-review-cutting-cords-not-corners-18592032, published Sep. 18, 2019 (retrieved Mar. 8, 2022).

Patterson, "Ears-on with the Sonos Move Bluetooth speaker: Portable Sonos sound with Alexa and Google Assistant onboard", http://www.techhive.com/article/583972/ears-on-with-the-sonos-move-bluetooth-speaker.html, published Sep. 5, 2019 (retrieved Mar. 11, 2022).

Davies, "Sonos Move Auto Trueplay Update Released to Expand Smart EQ" Mar. 9, 2022, https_www.slashgear.com/?url=https%3A%2F%Fwww.slashgear.com%2Fsonos-move-auto-trueplay-update-released-to-expand-smart-eq-09 . . . , published Mar. 9, 2021 (retrieved Mar. 14, 2022).

O'Boyle, "What is Sonos Trueplay and how does it work?" Mar. 9, 2021, https://www.pocket-lint.com/speakers/news/sonos/135396-what-is-sonos-trueplay-and-how-does-it-work, published Mar. 9, 2021 (retrieved Mar. 14, 2022).

* cited by examiner

| | C1 | C2 | C3 | C4 | C5 | C6 |
|---|---|---|---|---|---|---|
| | Frequency Band (in Hz) | Mic Spectral Average (in dB) | Playback Spectral Average (in dB) | Spectral Shape Difference (in dB) | Correction (in dB) | DPE Parameters (in dB) |
| R1 | 0-150 | -11.431 | 34.755 | 16.240 | 1.367 | 1.000 |
| R2 | 150-300 | -3.993 | 33.565 | 4.776 | 1.702 | 1.500 |
| R3 | 300-500 | -4.846 | 30.198 | -0.616 | 0.091 | 0.000 |
| R4 | 500-1000 | -5.939 | 25.292 | 0.501 | 1.091 | 1.000 |
| R5 | 1000-2000 | -1.930 | 23.140 | -1.763 | -1.361 | -1.361 |
| R6 | 2000-4000 | -3.541 | 21.507 | -2.550 | -1.392 | -1.392 |
| R7 | 4000-6000 | 0.455 | 14.894 | -6.271 | -4.188 | -4.188 |
| R8 | 6000-9000 | 2.100 | 12.578 | -6.320 | 0.865 | 0.865 |
| R9 | 9000-12000 | -6.347 | 10.162 | -3.372 | 4.349 | 4.349 |
| R10 | 12000-16000 | -13.570 | 6.649 | -0.625 | 3.890 | 3.775 |
| R11 | 16000-22000 | -38.509 | 1.594 | -6.626 | 0.091 | 0.000 |

REAL-TIME ADAPTATION OF AUDIO PLAYBACK

CROSS-REFERENCE TO RELATED APPLICATIONS

This application claims priority to U.S. Provisional Patent Application No. 63/159,810, filed on Mar. 11, 2021, which is hereby incorporated by reference in its entirety.

BACKGROUND

The present disclosure relates generally to processing audio signals.

SUMMARY

Aspects of the subject technology relate to dynamic audio processing effects and software applications that may utilize such effects. Streaming media content can be played from a device. Such streaming media content has an initial signal quality. When the audio is played in an environment, the initial signal can be modified by the environment. Also, for example, hardware limitations of an audio output component (e.g., speakers) playing the audio can modify the initial signal. This may lead to a diminished user experience of the audio playback.

Techniques to solve this problem are generally directed to calibrate a speaker to adapt to an environment of the speaker by playing a test tone and adapting sound energy levels based on an analysis of the test tone as captured by a microphone. The test tone is typically a predetermined tone, and generally not adapted to a playback device, an environment, media applications, media type, and so forth. The microphone may be separate from the device that plays the audio. Also, for example, the microphone is physically placed by a user at a location of their choice. Typically, such calibration is initiated by the user, requires an external hardware to detect the audio playback, and is generally performed in a static manner (e.g., for a home theater system with a fixed physical arrangement of speakers in a fixed physical environment). For example, changes to the environment and/or arrangement of the speakers may not be automatically detected, and the audio playback may not be enhanced dynamically. Also, for example, playing a test tone may pause playback of streaming media content, thereby affecting a user's enjoyment of the streaming media content. Such solutions are also not adaptive to a change in a location of the speakers, a change in a type of speaker, a change in a media playback application, and so forth. In instances where audio playback can be adapted to a particular media playback application, the adaptation is limited to the particular media playback application.

Some calibration techniques may have an ability to adapt to changes in the location of a speaker (e.g., identify a change in location by detecting a movement of the speaker). These techniques may involve utilizing predetermined sound profiles for various locations. In some techniques, the calibration may be based on a factory setting for a speaker profile. In some other instances, a retuning of the speaker may be performed.

When calibrating a speaker, a baseline profile used for the calibration plays an important role. For example, a device may capture audio playing in an environment, and determine an acoustic profile for the environment. In some instances, a calibration can be performed by comparing the acoustic profile for the environment with the baseline profile. However, the quality of the baseline profile may affect a quality of calibration. As previously indicated, in some instances, the baseline profile may be a speaker profile as determined at the factory (e.g., under ideal acoustic conditions), and/or the baseline profile may be predetermined for various locations. Some existing technologies perform calibrations based on a type of musical content being played. For example, a database may maintain a plurality of patterns of audio content, and a calibration process may be configured to select an optimally matching pattern from the database to determine the calibration. However, such calibrations may not successfully calibrate the playback to maintain consistency with the actual media content being played.

Generally, there are at least two aspects to a calibration: the environment, and the content being played. In order to maintain consistency of a playback in the environment with the actual media content being played, a comparison of the characteristics of the actual media content being played, and the playback as playing in the environment, is significant. Both of these aspects are time varying, and therefore an optimal real-time calibration needs to be dynamically adapted to both of these aspects.

The subject technology described herein may help to provide a solution to the problems described above. As described herein, an adaptive audio processing system and architecture is described, wherein a device is able to automatically and dynamically adapt to an environment by tapping into the streaming media content before it is played into an environment, capturing the streaming media content that is being played in the environment, and analyzing differences between the two. In some implementations, the process may be run in the background, and without test tones, and/or user involvement, thereby preventing disruption of user experience. Also, for example, in other implementations, test tones may be generated based on a device, an environment, a media playback application, a type of media, and so forth. As another example, as described herein, changes in an environment may be automatically detected, and the playback audio can be enhanced automatically.

For example, when a device plays an initial audio signal in an environment, the initial signal may be modified by the environment, and/or configurations or limitations of the audio component (e.g., a speaker) that outputs the signal to the environment. Such a modified signal can be captured by the device from the environment. A controller unit of a computing device is provided to process the audio signal as it is played into the environment, compare it to the initial signal that was played by a media playback application before the media content is played into the environment, and determine correction parameters that can restore the audio signal as played in the environment to its initial signal quality, thereby mitigating any adverse effects of the environment, the audio output component, and/or the device itself. The controller unit sets parameters for adjusting the streaming media content as it is played by the device. In this manner, regardless of the media playback application or the environment, the sound quality as played adapts to the environment and is audible with reduced adverse audio effects. As an advantage, various media playback applications do not have to separately implement audio processing algorithms. The subject technology described herein may be utilized in a number of different ways, some of which are described below, with one such use being for dynamically adapting the audio to the environment of the device.

Accordingly, in a first example embodiment, a device is provided that includes an audio output controller. The audio output controller is communicatively linked to an audio output component, an audio input component, and one or more media playback applications. The device also includes one or more processors operable to perform operations. The operations include determining, by the audio output controller during a dynamic audio calibration process and based on a first digital signal representing a first portion of streaming media content provided by a media playback application to the audio output component, one or more audio characteristics of the streaming media content. The operations also include playing, by the audio output component into an environment, the first portion of the streaming media content. The operations additionally include capturing, by the audio input component, a second digital signal representing the first portion of the streaming media content as played by the audio output component into the environment. The operations further include determining, based on the captured second digital signal, one or more detected audio characteristics of the streaming media content as played into the environment. The operations additionally include determining a difference between the one or more audio characteristics of the streaming media content and the one or more detected audio characteristics of the streaming media content. The operations further include calibrating a second portion of the streaming media content based on the difference and based on a determination that the second portion is to be calibrated. The operations additionally include playing, by the audio output component to the environment, the second portion as calibrated.

In a second example embodiment, a computer-implemented method is provided that includes determining, during a dynamic audio calibration process and based on a first digital signal representing a first portion of streaming media content provided by a media playback application to an audio output component, one or more audio characteristics of the streaming media content. The computer-implemented method also includes playing, by the audio output component into an environment, the first portion of the streaming media content. The computer-implemented method additionally includes capturing, by an audio input component, a second digital signal representing the first portion of the streaming media content as played by the audio output component into the environment. The computer-implemented method further includes determining, based on the captured second digital signal, one or more detected audio characteristics of the streaming media content as played into the environment. The computer-implemented method also includes determining a difference between the one or more audio characteristics of the streaming media content and the one or more detected audio characteristics of the streaming media content. The computer-implemented method additionally includes calibrating a second portion of the streaming media content based on the difference and based on a determination that the second portion is to be calibrated. The computer-implemented method additionally includes playing, by the audio output component to the environment, the second portion as calibrated.

In a third example embodiment, an article of manufacture including a non-transitory computer-readable medium is provided having stored thereon program instructions that, upon execution by one or more processors of a computing device, cause the computing device to carry out operations. The operations include determining, during a dynamic audio calibration process and based on a first digital signal representing a first portion of streaming media content provided by a media playback application to an audio output component, one or more audio characteristics of the streaming media content. The operations also include playing, by the audio output component into an environment, the first portion of the streaming media content. The operations additionally include capturing, by an audio input component, a second digital signal representing the first portion of the streaming media content as played by the audio output component into the environment. The operations further include determining, based on the captured second digital signal, one or more detected audio characteristics of the streaming media content as played into the environment. The operations additionally include determining a difference between the one or more audio characteristics of the streaming media content and the one or more detected audio characteristics of the streaming media content. The operations further include calibrating a second portion of the streaming media content based on the difference and based on a determination that the second portion is to be calibrated. The operations additionally include playing, by the audio output component to the environment, the second portion as calibrated.

In a fourth example embodiment, a system is provided that includes means for determining, during a dynamic audio calibration process and based on a first digital signal representing a first portion of streaming media content provided by a media playback application to an audio output component, one or more audio characteristics of the streaming media content. The system also includes means for playing, by the audio output component into an environment, the first portion of the streaming media content. The system additionally includes means for capturing, by an audio input component, a second digital signal representing the first portion of the streaming media content as played by the audio output component into the environment. The system further includes means for determining, based on the captured second digital signal, one or more detected audio characteristics of the streaming media content as played into the environment. The system also includes means for determining a difference between the one or more audio characteristics of the streaming media content and the one or more detected audio characteristics of the streaming media content. The system additionally includes means for calibrating a second portion of the streaming media content based on the difference and based on a determination that the second portion is to be calibrated. The system also includes means for playing, by the audio output component to the environment, the second portion as calibrated.

It is understood that other configurations of the subject technology will become readily apparent to those skilled in the art from the following detailed description, where various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding and are incorporated in and constitute a part of this specification, illustrate disclosed aspects and together with the description serve to explain the principles of the disclosed aspects.

FIG. 3B illustrates a table with example values for signal processing for dynamic adaptive audio, in accordance with example embodiments.

DETAILED DESCRIPTION

Figure 1:
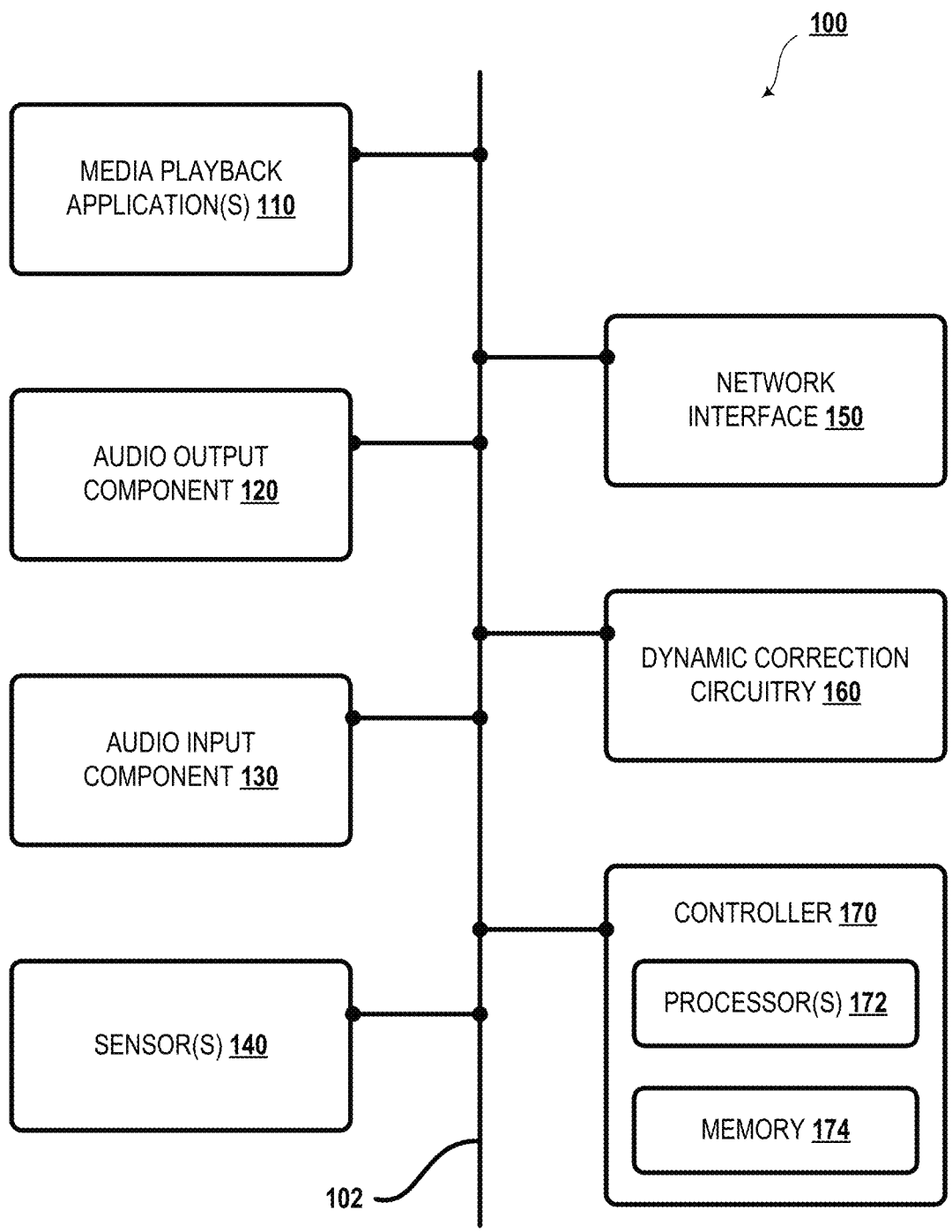
FIG. 1 illustrates a computing device, in accordance with example embodiments.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting.

Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

Operating systems of computing devices, for example those targeted for mobile devices, have simple built-in audio processing effects and offer limited options to dynamically adapt to an environment of the device. Specifically, operating systems may be provided with audio processing architectures that are limited to a fixed number of bands (e.g., frequency bands) for equalization (EQ), a multi-band compressor (MBC), and fixed sizes and frequencies of the bands. However, utilizing the built-in audio processing effects available in the operating system platform may allow access to certain audio data paths (e.g., telephonic audio signal path, access to multiple media playback applications, etc.) of the computing devices that are not directly accessible to developers for security reasons. There may be audio processing solutions that may implement similar-but-still-different enough architectures/modules using the common built-in audio processing effects that are not flexible enough for developers. Thus, in order to realize the desirable audio processing effects, the developers without the privileges of using built-in audio processing effects are required to build their own solutions that add complexity to the application designs, and may not be applicable beyond a specific media playback application. The term "media playback application" as used herein may generally refer to any software application (e.g., a mobile app such as YouTube™) that is configured to play streaming media content. For example, the media playback application may be an application installed on a mobile device, and configured to receive streaming media content (e.g., from an online media content provider, media content delivery system, etc.), and play the received content by the audio output device. For example, the media playback application on a mobile device may play the streaming media content from a speaker of the mobile device. In some examples, the streaming media content can be provided to an audio output component separate from the mobile device (e.g., a speaker, a pair of headphones, etc.). For example, the streaming media content can be provided to the audio output component over a communication network (e.g., Bluetooth™, Wi-Fi™, etc.).

In accordance with one or more implementations, methods and systems for dynamic processing effects of audio signals are herein disclosed. According to various aspects of the subject technology, an adaptive audio processing architecture is built in the operating system of a computing device, to dynamically adapt audio processing to an environment and achieve desirable audio signal processing effects.

II. Example Devices

FIG. 1 illustrates computing device 100, in accordance with example embodiments. Computing device 100 can be a computer, phone, personal digital assistant (PDA), or any other sort of electronic device. Such an electronic system includes various types of computer readable media and interfaces for various other types of computer readable media. Computing device 100 includes a bus 102, one or more media playback applications 110, an audio output component 120, an audio input component 130, one or more sensors 140, network interface 150, dynamic correction circuitry 160, and controller 170. In some examples, computing device 100 may take the form of a desktop device, a server device, or a mobile device. Computing device 100 may be configured to interact with an environment. For example, computing device 100 may record audio signals from an environment around computing device 100.

Bus 102 collectively represents all system, peripheral, and chipset buses that communicatively connect the numerous internal devices of computing device 100. For instance, bus 102 communicatively connects processor(s) 172 with memory 174. Bus 102 also connects to input and output device interfaces (not shown). The input device interface enables the user to communicate information and select commands to computing device 100. Input devices used with the input device interface include, for example, alphanumeric keyboards, pointing devices (also called "cursor control devices"), and sound capturing devices (e.g., microphones). The output device interface enables, for example, the playback of sound, the display of images generated by computing device 100, and so forth. Output devices used with the output device interface include, for example, printers, display devices (e.g., cathode ray tubes (CRT) or liquid crystal displays (LCD)), and sound playback devices (e.g., speakers). Some implementations include devices, for example, a touchscreen that functions as both input and output devices. Bus 102 also couples computing device 100 to a network (not shown) through network interface 150. In this manner, the computer can be a part of a network of computers (for example, a LAN, a WAN, or an Intranet, or a network of networks, for example, the Internet). Any or all components of computing device 100 can be used in conjunction with the subject disclosure.

In some embodiments, computing device 100 can include audio output component 120. Audio output component 120 can be configured to output audio to an environment of computing device 100. In some embodiments, audio output component 120 may be a part of computing device 100. For example, audio output component 120 may include a plurality of speakers located on computing device 100. In some embodiments, audio output component 120 may be part of a second device communicatively coupled to computing device 100. For example, audio output component 120 may be a network device configured to output audio, one or more speakers, an audio amplifier system, a headphone, a car audio, and so forth.

In some embodiments, computing device 100 can include audio input component 130. Audio input component 130 can be configured to record audio from an environment of computing device 100. For example, audio output component 120 may play music from computing device 100 to an environment of computing device 100, and audio input component 130 may record the music as played in the environment. In some embodiments, audio input component 130 may be a part of computing device 100. For example, audio input component 130 may include a plurality of speakers located on computing device 100. In some embodiments, audio input component 130 may be part of a second device communicatively coupled to computing device 100. For example, audio input component 130 may be a network device configured to record audio, such as a microphone (e.g., in a headphone, a car audio), and so forth. For example, audio input component 130 may be a smart device (e.g., a smart watch, a mobile device) configured to capture audio and communicate the audio signal as captured in an environment to computing device 100.

In some embodiments, computing device 100 can include one or more sensors 140. Sensor(s) 140 can be configured to measure conditions within computing device 100 and/or conditions in an environment of (e.g., within 1 m, 5 m, or 10 m of) computing device 100 and provide data about these conditions. For example, sensor(s) 140 can include one or more of: (i) sensors for obtaining data about computing device 100, such as, but not limited to, a battery sensor for measuring power of one or more batteries of computing device 100, and/or other sensors measuring conditions of computing device 100; (ii) an identification sensor to identify other objects and/or devices, such as, but not limited to, a Radio Frequency Identification (RFID) reader, proximity sensor, one-dimensional barcode reader, two-dimensional barcode (e.g., Quick Response (QR) code) reader, and/or a laser tracker, where the identification sensor can be configured to read identifiers, such as RFID tags, barcodes, QR codes, and/or other devices and/or objects configured to be read, and provide at least identifying information; (iii) sensors to measure locations and/or movements of computing device 100, such as, but not limited to, a tilt sensor, a gyroscope, an accelerometer, a Doppler sensor, a Global Positioning System (GPS) device, a sonar sensor, a radar device, a laser-displacement sensor, and/or a compass; (iv) an environmental sensor to obtain data indicative of an environment of computing device 100, such as, but not limited to, an infrared sensor, an optical sensor, a biosensor, a capacitive sensor, a touch sensor, a temperature sensor, a wireless sensor, a radio sensor, a movement sensor, a proximity sensor, a radar receiver, a microphone, a sound sensor, an ultrasound sensor and/or a smoke sensor; and/or (v) a force sensor to measure one or more forces (e.g., inertial forces and/or G-forces) acting about computing device 100, such as, but not limited to one or more sensors that measure: forces in one or more dimensions, torque, ground force, friction, and/or a zero moment point (ZMP) sensor that identifies ZMPs and/or locations of the ZMPs. Many other examples of sensor(s) 140 are possible as well.

Data gathered from sensor(s) 140 may be communicated to controller 170, which may use the data to perform one or more actions. For example, data gathered from a movement sensor can be communicated to controller 170, which may detect a movement of the device. In some embodiments, controller 170 may trigger the capturing of a digital signal that is playing from the audio output component 120. In some embodiments, the triggering may be performed in response to a determination that a movement measurement exceeds a threshold value. For example, controller 170 may determine that the movement measurement exceeds the threshold value and infer that the environment of computing device 100 may have changed. Accordingly, controller 170 may determine that an audio adjustment can be performed.

Network interface 150 can include one or more wireless interfaces and/or wireline interfaces that are configurable to communicate via a network. Wireless interfaces can include one or more wireless transmitters, receivers, and/or transceivers, such as a Bluetooth™ transceiver, a Zigbee® transceiver, a Wi-Fi™ transceiver, a WiMAX™ transceiver, and/or other similar types of wireless transceivers configurable to communicate via a wireless network. Wireline interfaces can include one or more wireline transmitters, receivers, and/or transceivers, such as an Ethernet transceiver, a Universal Serial Bus (USB) transceiver, or similar transceiver configurable to communicate via a twisted pair wire, a coaxial cable, a fiber-optic link, or a similar physical connection to a wireline network.

In some embodiments, network interface 150 can be configured to provide reliable, secured, and/or authenticated communications. For each communication described herein, information for facilitating reliable communications (e.g., secured media content delivery) can be provided, perhaps as part of a secure data packet transmission (e.g., packet/message sequencing information, encapsulation headers and/or footers, size/time information, and transmission verification information such as cyclic redundancy check (CRC) and/or parity check values). Communications can be made secure (e.g., be encoded or encrypted) and/or decrypted/decoded using one or more cryptographic protocols and/or algorithms, such as, but not limited to, Data Encryption Standard (DES), Advanced Encryption Standard (AES), a Rivest-Shamir-Adelman (RSA) algorithm, a Diffie-Hellman algorithm, a secure sockets protocol such as Secure Sockets Layer (SSL) or Transport Layer Security (TLS), and/or Digital Signature Algorithm (DSA). Other cryptographic protocols and/or algorithms can be used as well or in addition to those listed herein to secure (and then decrypt/decode) communications.

Dynamic correction circuitry 160 may include circuitry that could compensate for audio defects caused by the environment. For example, dynamic correction circuitry 160 may include circuitry that could determine parameters for calibrating the second portion of the streaming media content. Also, for example, dynamic correction circuitry 160 may accommodate ambient noise by setting the parameters to reduce a loud noise and turning up a quiet sound. In some embodiments, dynamic correction circuitry 160 may have access to a database including information regarding types of speakers or microphones. Based on the types of speakers or microphones used in an application, dynamic correction circuitry 160 may include parameters to compensate for the sound output through the speaker or picked up through the microphone. For example, when the speaker on a computing device does not accommodate low frequencies, the adaptive audio processing architecture may be set to compensate for a lack of low frequencies of the speaker.

As another example, dynamic correction circuitry 160 may include circuitry that could determine a value offset for an audio output associated with the device. To do this, the operations may include playing, by the audio output component to a test environment of the device, a test signal (e.g., a white-noise signal, a test tone, a chirp, a signal comprising one or more test frequencies, and so forth). The operations may also include capturing, by the audio input component, the test signal as played in the test environment. Dynamic correction circuitry 160 may then determine the value offset based on a difference between respective spectral shapes of the test signal as played and the test signal as captured.

In some embodiments, dynamic correction circuitry 160 may include circuitry that could generate a test signal based on at least one of the environment, the device, or the media playback application. For example, dynamic correction circuitry 160 may include circuitry that could dynamically determine an appropriate test signal for a particular device. For example, when the speaker on a computing device does not accommodate low frequencies, dynamic correction circuitry 160 may generate a test signal comprising the low frequencies. The operations may also include playing, by the audio output component to the environment of the device, the test signal as generated. As another example, after the second portion as calibrated is played in the environment, dynamic correction circuitry 160 may determine that a test signal needs to be generated to perform a better calibration. For example, dynamic correction circuitry 160 may determine, based on capturing and analyzing an additional digital signal based on the second portion as played, dynamic correction circuitry 160 may determine that the additional digital signal is not within a threshold of a target signal. Accordingly, dynamic correction circuitry 160 may generate a test signal, for example, by identifying one or more frequencies that may need to be adjusted. The operations may also include capturing, by the audio input component, the test signal as played in the environment. Dynamic correction circuitry 160 may then determine the value offset based on a difference between respective spectral shapes of the test signal as played and the test signal as captured.

Controller 170 may include one or more processors 172 and memory 174. Processor(s) 172 can include one or more general purpose processors and/or one or more special purpose processors (e.g., display driver integrated circuit (DDIC), digital signal processors (DSPs), tensor processing units (TPUs), graphics processing units (GPUs), application specific integrated circuits (ASICs), etc.). Processor(s) 172 can be a single processor or a multi-core processor in different implementations. Processor(s) 172 may be configured to execute computer-readable instructions that are contained in memory 174 and/or other instructions as described herein.

Memory 174 may include one or more non-transitory computer-readable storage media that can be read and/or accessed by processor(s) 172. The one or more non-transitory computer-readable storage media can include volatile and/or non-volatile storage components, such as optical, magnetic, organic or other memory or disc storage, which can be integrated in whole or in part with at least one of processor(s) 172. In some examples, memory 174 can be implemented using a single physical device (e.g., one optical, magnetic, organic or other memory or disc storage unit), while in other examples, memory 174 can be implemented using two or more physical devices. ROM stores static data and instructions that are needed by processor(s) 172 and other modules of computing device 100. Some implementations use a permanent storage device that is a read-and-write memory device. For example, some implementations may use a removable storage device (for example, a floppy disk, flash drive) as a permanent storage device. Like the permanent storage device, a system memory may be used that is a read-and-write memory device. However, system memory is a volatile read-and-write memory, such as a random access memory. System memory may store some of the instructions and data that processor(s) 172 need at runtime. In some implementations, the processes of the subject disclosure are stored in the system memory, permanent storage device, or ROM. For example, the various memory units comprising memory 174 include instructions for displaying graphical elements and identifiers associated with respective applications, receiving a predetermined user input to display visual representations of shortcuts associated with respective applications, and displaying the visual representations of shortcuts. From these various memory units, processor(s) 172 retrieves instructions to execute and data to process in order to execute the processes of some implementations.

In example embodiments, processor(s) 172 are configured to execute instructions stored in memory 174 so as to carry out operations.

The operations may include determining, during a dynamic audio calibration process and based on a first digital signal representing a first portion of streaming media content provided by a media playback application to an audio output component, one or more audio characteristics of the streaming media content. For example, audio content from a media playback application can be played, and the first digital signal represents the audio content as it is initially transmitted by the media playback application to audio output component 120, prior to the audio content being played into an environment of computing device 100. In some embodiments, the media playback application may play audio from an audio source file, and the first digital signal may represent the audio content of the audio source file. Generally, the first digital signal captures pure characteristics of the media content (e.g., as recorded in a studio, as played by an artist, as streamed to the device by an online service provider of media content, as stored in an audio source file, and so forth). For a dynamic calibration to be optimal with respect to the media content that is playing, it is of high significance that the calibration take into account characteristics of the before it is played in the environment, and compare this to the detected characteristics of the media content as it plays in the environment. Accordingly, in some aspects, the determining of the one or more audio characteristics of the streaming media content can involve determining one or more artist-intended audio characteristics of the streaming media content by tapping into the first portion of the streaming media content. The tapping can occur subsequent to the first portion being provided by the media playback application, and prior to the first portion being received by the audio output component. This is illustrated with reference to playback audio capture 204 in FIG. 2, or audio content 302 in FIG. 3.

The term "dynamic audio calibration" as used herein may generally refer to a calibration "on the fly" that is tailored to characteristics of an environment (e.g., an acoustic signature of the environment), as well as tailored to characteristics of the streaming media content as initially transmitted by the media playback application to audio output component 120, prior to the audio content being played into an environment of computing device 100. Also, for example, the dynamic audio calibration can refer to an ability to adapt to changes in one or more of the environment, audio output component 120, or the streaming media content. As another example, the dynamic audio calibration can refer to an ability to monitor an output quality of audio output component 120 from time to time, and perform additional recalibrations as may be deemed reasonable. Also, for example, the dynamic audio calibration can refer to an iterative process that progressively fine tunes the acoustics of the streaming media content.

The operations may also include playing, by the audio output component into an environment, the first portion of the streaming media content. For example, audio output component 120 can play the streaming media content in the environment of computing device 100.

The operations may further include capturing, by an audio input component, a second digital signal representing the first portion of the streaming media content as played by the audio output component into the environment. For example, audio input component 130 can record the streaming media content as it is played into an environment. Controller 170 may generate the second digital signal representing the streaming media content as played into the environment.

The operations may further include determining, based on the captured second digital signal, one or more detected audio characteristics of the streaming media content as played into the environment. For example, controller 170 may determine an acoustic signature of the streaming media content as it plays in the environment. In some embodiments, the one or more detected audio characteristics may take into account physical attributes of the environment (e.g., shape, size, height of a ceiling, noise levels, and so forth). In some embodiments, the one or more detected audio characteristics may take into account if a device playing the streaming media content is in a pocket, next to a pillow, on a couch, and so forth).

The operations may also include determining a difference between the one or more audio characteristics of the streaming media content and the one or more detected audio characteristics of the streaming media content. For example, controller 170 may determine a relative difference between the first digital signal and the second digital signal. For example, for a particular frequency band, the energy in the first digital signal may be twice the energy in the second digital signal. Accordingly, controller 170 may determine a relative difference of "half the energy level."

The operations may further include calibrating a second portion of the streaming media content based on the difference and based on a determination that the second portion is to be calibrated. For example, upon a determination of the difference between the first digital signal and the second digital signal, controller 170 may dynamically adjust the audio content that is to be played into the environment by applying a correction. For example, when a relative difference of "half the energy level" is determined, controller 170 can automatically compensate for the difference in energy levels. In some instances, this may be achieved by doubling the energy output of the affected frequency band. In other embodiments, this may be achieved by lowering energy levels of frequency bands other than the affected frequency band.

The operations may also include playing, by the audio output component to the environment, the second portion as calibrated. For example, when the correction is applied to the second portion of the audio content, this may be output by audio output component 120.

In some instances, such a correction process may be performed iteratively to achieve a desired level of sound enhancement.

III. Example Digital Signal Processing

Figure 2:
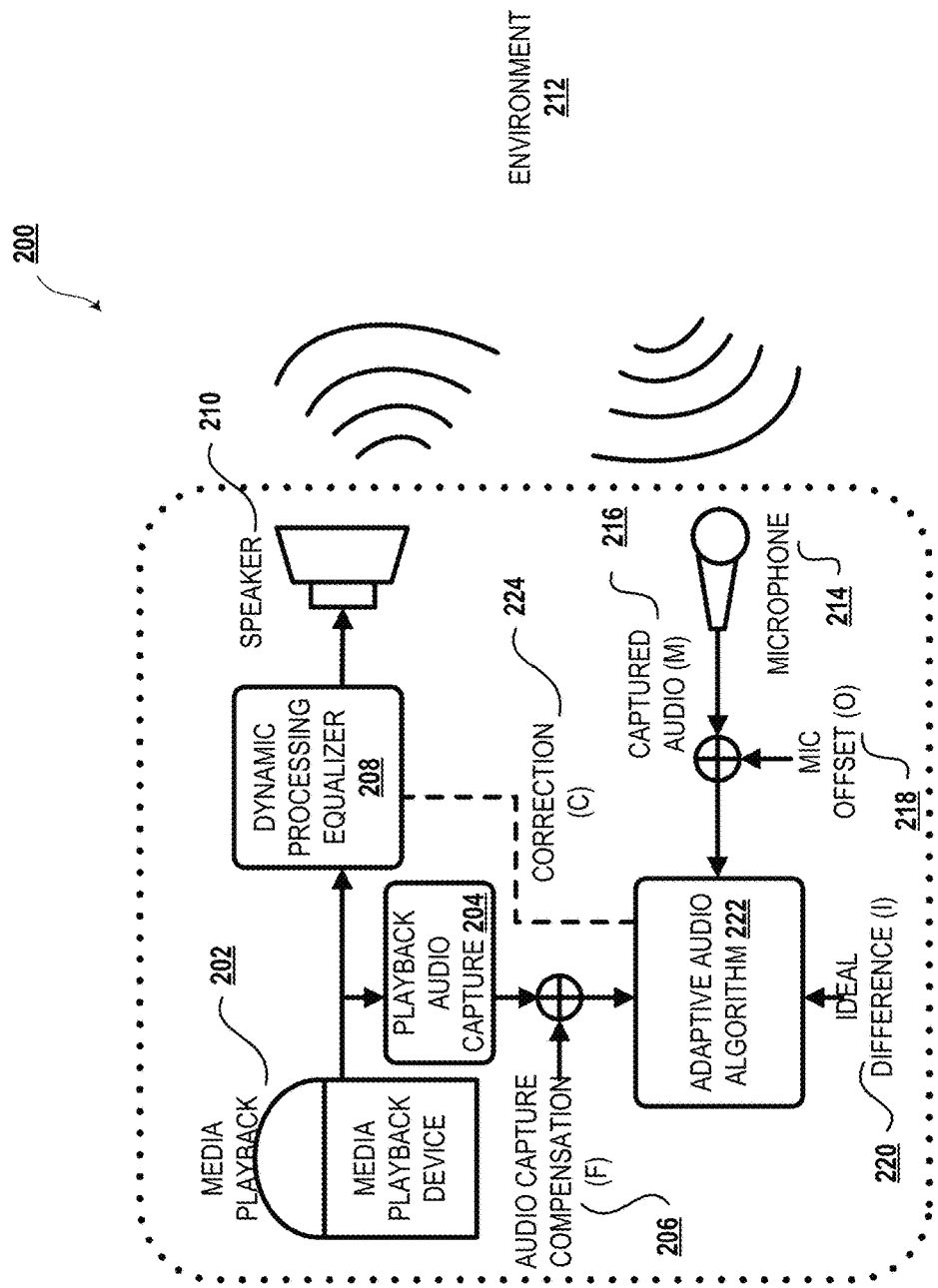
FIG. 2 illustrates a sample dynamic adaptive audio processing architecture, in accordance with example embodiments.

FIG. 2 illustrates sample dynamic adaptive audio processing architecture 200, in accordance with example embodiments. Media playback application 202 plays playback audio. The playback audio is captured from media playback application 202 as playback audio capture 204. For example, controller 170 can determine a first digital signal representing a first portion of streaming media content as output by a media playback application. This can be determined based on the playback audio captured by playback audio capture 204 to generate audio capture compensation (F) 206. Generally, audio capture compensation (F) 206 compensates for known irregularities of playback audio capture 204. For example, playback audio capture 204 may have a known offset in some frequency bands, and F 206 can compensate for such offset. In other words, playback audio capture 204 may not have access to the streaming media content as played by the media playback application, and may therefore need to be compensated. In some embodiments, the playback audio is also received by the dynamic processing equalizer (DPE) 208. For example, the playback audio can be transmitted to DPE 208 when it is transmitted to playback audio capture 204. In some embodiments, the playback audio can be transmitted to DPE 208 after it is transmitted to playback audio capture 204, and/or after the first digital signal is determined.

In some embodiments, after determining the first digital signal, an audio output component, such as speaker 210, may play the first portion of the streaming media content to an environment 212 (e.g., of the device).

In some embodiments, an audio input component, such as microphone 214, can capture a second digital signal representing the first portion of the streaming media content as played into environment 212. Microphone 214 can include one or more microphones to capture audio. Microphone 214 can be part of a separate device in environment 212. For example, microphone 214 may be a smartwatch of a user in environment 212. In some embodiments, controller 170 can determine captured audio (M) 216. For example, captured audio 216 can be determined based on an average of audio signals from multiple channels into a single channel, and/or an average of audio signals from multiple microphones in environment 212. In some implementations, beamforming and/or other summing techniques may be utilized. For example, different devices may have speaker 210 located at different locations. Some devices may also include multiple speakers. In some implementations, speaker 210 may be part of another device different from the device that is playing the audio. For example, an audio playing device may transmit audio to a speaker 210 in environment 212, such as, for example, a Bluetooth™ speaker, an audio system in an automobile, and so forth. Accordingly, microphone 214 can perform beamforming to determine a location of speaker 210, and identify a source of captured audio 216. Accordingly, controller 170 can determine whether the audio source is a first source, say source A, and whether ambient noise is being output by a second source, say source B. Accordingly, controller 170 can instruct microphone 214 to listen to source A for captured audio 216. As another example, controller 170 can identify a microphone 214 that may be covered and/or not able to detect audio, and instruct the remaining microphones 214 to record captured audio 216. In some implementations, machine learning models, such as, for example, tensor flow techniques, may be utilized to perform an optimization of the captured audio 216.

In some embodiments, a mic offset (O) 218 may be determined. For example, mic offset 218 may be a digital characterization of environment 212 that may be used to make further determinations, such as a type of algorithm to employ (e.g., adaptive audio algorithm 222), assess changes in environment 212, and/or other use one or more audio processing applications.

In some embodiments, an ideal difference (I) 220 may be determined. For example, when a test signal, such as a white noise (i.e., equal energy level for all frequencies), is played by speaker 210 in a test environment, the test environment may modify the output audio. This output audio may be used to compute ideal difference 220. When speaker 210 plays playback audio from media playback application 202, and/or dynamic processing equalizer 208, the playback audio may be further modified by environment 212. For example, environment 212 may enhance streaming media content in a particular frequency range. Accordingly, characteristics of environment 212 can be determined by analyzing captured audio 216 with ideal difference 220. In some embodiments, ideal difference 220 can be determined for environment 212 as an average over measurements under different conditions. Also, in some embodiments, ideal difference 220 can be determined as an average of measurements in multiple environments. In some embodiments, the calibrating of the second portion of the streaming media content based on the difference involves applying the difference as an input to a machine learning model in order to determine an output audio setting. Some embodiments can involve outputting the second portion using the audio output component and using the determined output audio setting.

Controller 170 can use adaptive audio algorithm 222 to determine a difference between the first digital signal and the second digital signal. Adaptive audio algorithm 222 may describe an audio algorithm, process, and/or audio effects chain for solutions (e.g., software applications) that utilize multi-channel equalization and/or multi-band compression. For example, playback audio capture 204 and audio capture compensation 206 can be used as input for adaptive audio algorithm 222. Also, for example, captured audio 216, mic offset 218, and/or ideal difference 220, can be used as input for adaptive audio algorithm 222. Controller 170 may determine coefficients for a correction (C) 224. Correction 224 represents coefficients to be applied by dynamic processing equalizer 208 to playback audio played by media playback application 202 before it is output by speaker 210 to environment 212.

In some embodiments, the first digital signal may represent an aggregate of the first portion of the streaming media content as output by the media playback application, and a portion of another streaming media content as output by a second media playback application of the one or more media playback applications. For example, more than one media playback application may be playing streaming media content, and respective signals output by each media playback application may be aggregated to form the first digital signal. Also, for example, the two separate streaming media contents from two separate media playback applications may be played into environment 212, and the second digital signal may be an aggregate of the two separate streaming media contents as played into environment 212. Accordingly, each separate streaming media content can be calibrated with respect to the other, so as to output a balanced audio. In some embodiments, the streaming media content from the second media playback application may be enhanced or down-played based on a relative importance of the streaming media content from the media playback applications. For example, a first media application may be playing music and a second media playback application may be playing audio from a news video that a user is viewing. Accordingly, audio from the second media playback application can be calibrated to be enhanced, while the music from the first media playback application can be output without calibration, and/or at a lower volume. Also, for example, when the audio from the news video is no longer actively played (e.g. the user stops watching the news video), then the music from the first media playback application can be output with calibration, and/or at a higher volume. As another example, when a user is watching a video, and a ringtone begins to play, audio for the ringtone may be output without calibration.

Figure 3A:
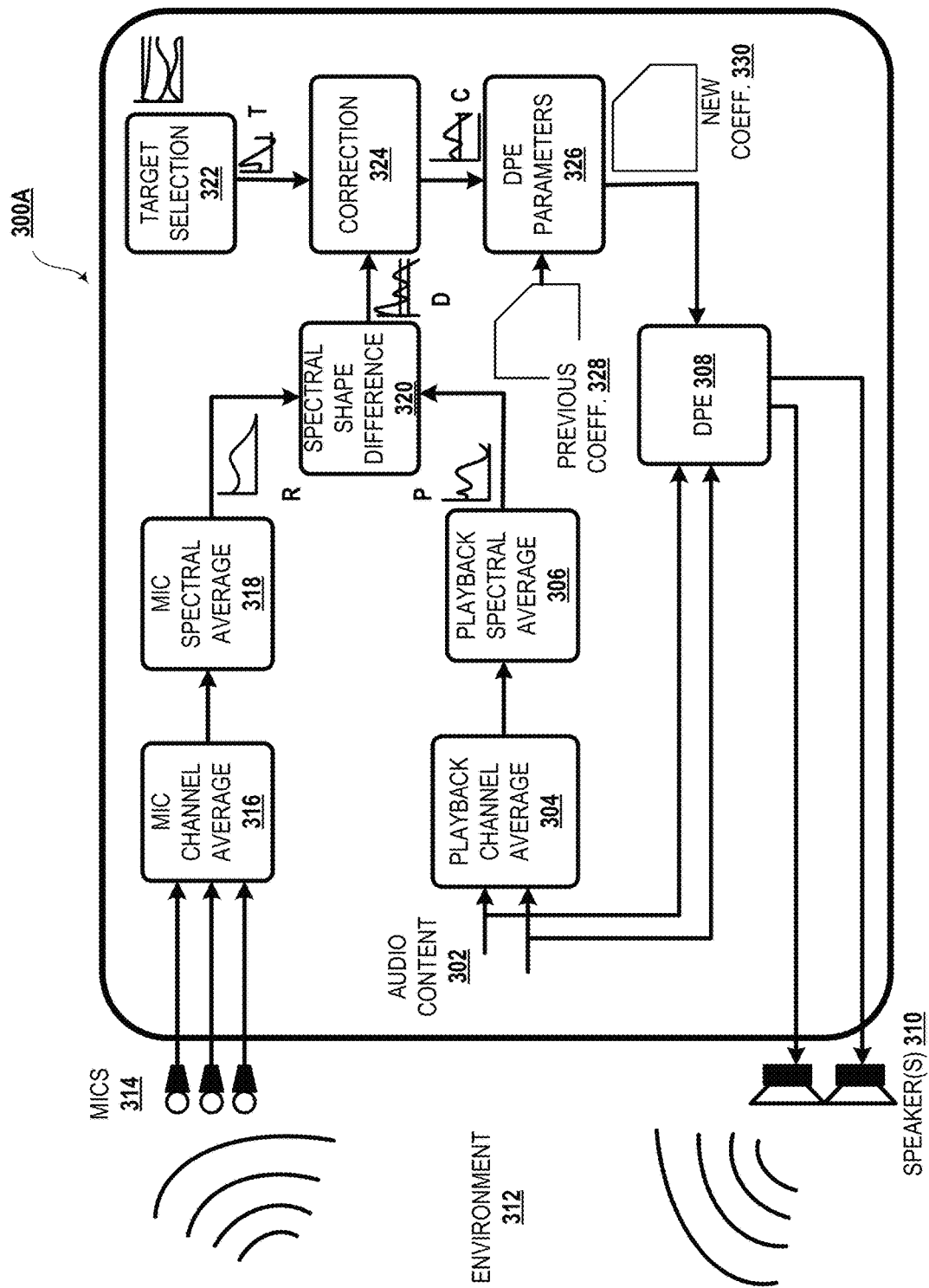
FIG. 3A illustrates sample signal processing for dynamic adaptive audio, in accordance with example embodiments.

FIG. 3A illustrates sample signal processing 300A for dynamic adaptive audio, in accordance with example embodiments. Generally, for purposes of this description, vectors representing digital signals are in a frequency domain. Streaming media content 302 can be played by a media playback application. Playback channel average 304 can be determined for streaming media content 302. In some embodiments, a first digital signal representing a first portion of streaming media content 302 as output by a media playback application of one or more media playback applications can be determined. For example, multiple channels can be averaged to determine playback channel average 304. A spectral average (P) 306 can be computed to determine a correction (e.g., correction 324) to be applied.

Streaming media content 302 may be (e.g., simultaneously) provided to dynamic processing equalizer, DPE 308. For example, the first portion of streaming media content 302 can be provided to DPE 308. In some embodiments, DPE 308 may apply predetermined coefficients (e.g., based on device and/or user configurations) to streaming media content 302. In some embodiments, the first portion of streaming media content 302 is played by an audio output component to an environment of the device. For example, DPE 308 plays streaming media content 302 via speaker(s) 310 to environment 312. As described herein, speaker(s) 310 may include multiple speakers. Also, for example, speaker(s) 310 may be a part of a computing device that processes streaming media content 302, or may be a separate device that outputs audio, such as, for example, speakers on a home network, a Bluetooth™ speaker, an audio system in an automobile, and so forth.

An audio input component, such as mics 314, can capture a second digital signal representing the first portion of streaming media content 302 as played into environment 312. Mics 314 can include one or more microphones. Mics 314 may be located at different portions of a device. In some embodiments, mics 314 may be distributed in environment 312. For example, mics 314 may include an arrangement of microphones located within an environment. In other instances, mics 314 may be a part of an audio system in an automobile. In some embodiments, mics 314 may be located on another device, such, as, for example, a smart watch, smart glasses, a second computing device. Generally, mic 314 is communicatively linked to the device.

Some embodiments may involve determining, based on the captured second digital signal, one or more detected audio characteristics of the streaming media content as played into the environment. The detected audio characteristics of the streaming media content generally refer to the audio characteristics that represent what a user may hear when listening to the streaming media content in the environment. The one or more detected audio characteristics may be based on the environment, limitations of the audio output component, and so forth. Generally, one or more detected audio characteristics are an acoustic signature of the content as played in the environment.

In some embodiments, a mic channel average 318 can be determined based on the captured streaming media content. For example, multiple channels can be averaged (e.g., a sum of respective signals) to determine mic channel average 318. In some embodiments, mic channel average 318 can separately analyze one or more channels independently.

In some embodiments, a mic spectral average (R) 318 is computed. Bandwidth extension and/or estimation techniques may be applied. In some embodiments, an algorithm may modify lower frequencies, and not modify high frequencies, or vice versa.

Generally, a channel average (e.g., playback channel average 304, mic channel average 318) may be determined in real-time as streaming media content is being played or audio playback is being captured to generate, for example, a monophonic signal. For example, as streaming media content 302 is played, a playback channel average 304 can be contemporaneously computed. Similarly, as audio playback is captured over multiple speakers, mic channel average 318 can be contemporaneously computed as an aggregate of signals from the multiple speakers. Subsequently, a spectral average (e.g., playback spectral average 306, mic spectral average (R) 318) can be computed over a certain time period. For example, playback spectral average 306 can be determined based on playback channel average 304 as computed determined over a period of time. Also, for example, mic spectral average (R) 318 can be determined based on mic channel average 318 as computed determined over a period of time. Accordingly, a spectral average is indicative of an average energy in one or more frequency bands in a respective channel average over a period of time. Generally, time periods of 10 to 20 second durations can be utilized to determine the spectral average (e.g., playback spectral average 306, mic spectral average (R) 318). Also, for example, the spectral average (e.g., playback spectral average 306, mic spectral average (R) 318) may be a rolling average that is updated over time.

In some embodiments, the audio input device (e.g., mics 314) may include a plurality of microphones in environment 312. Such embodiments may involve capturing the second digital signal by receiving, from the plurality of microphones, a plurality of signals. The embodiments may further involve calibrating the second portion based on an aggregate of the plurality of signals. For example, mic spectral average (R) 318 may comprise an aggregate of digital signals received from mics 314. In some embodiments, the audio input component may include a plurality of microphones. In some instances, a microphone may not be active, and/or be occluded. In such instances, mic spectral average (R) 318 can be adjusted to compensate for a loss of audio signal from a microphone. For example, relative weights may be applied to compute the aggregate of digital signals received from mics 314, where a lower weight can be assigned to a microphone that is inactive, occluded, damaged, etc.

In some embodiments, a difference between the one or more audio characteristics of the streaming media content and the one or more detected audio characteristics of the streaming media content is determined. For example, spectral shape difference (D) 320 is computed based on spectral average (P) 306 and mic spectral average (R) 318. Generally, respective spectral shapes of P 306 and R 318 are normalized to determine D 320. For example, respective averages, $R_{average}$ and $P_{average}$, may be removed from R 318 and P 306 to determine D 320, as provided below:

$$D_{dB} = (R_{dB} - R_{average}) - (P_{dB} - P_{average}) \quad \text{(Eqn. 1)}$$

where measurements are performed in decibels (dB). Based on empirical measurements, in some embodiments, averages may be performed for frequencies in the range 500 Hz to 2 KHz to allow for smaller differences in D 320.

Generally, actual difference values may not be needed. For example, D 320 may indicate a relative difference. For example, the energy level for a 500 Hz band may be half of the energy level for a 1000 Hz band. Accordingly, D 320 may indicate the difference as a factor "½" instead of an actual difference of the values.

Some embodiments involve determining a target output signal. In such embodiments, calibrating the second portion may include calibrating the second portion to be within a threshold of the target output signal. For example, target selection (T) 322 may be performed. Generally, T 322 may comprise an idealized "flat" signal (i.e., energy levels for frequencies are zero). In some embodiments, certain frequency ranges can be modified, such as, for example, frequencies corresponding to bass and/or treble. In some embodiments, T 322 may be based on user preference. Also, for example, T 322 can be based on streaming media content, media playback application, the device, an environment, and so forth.

For example, T 322 may include adjustment criteria based on a system of the device, can perform averaging of adjustments made over time, and/or access a database (e.g., a lookup table) to determine adjustment criteria to be applied based on device settings as configured at the factory. For example, a device may not output low frequencies, and so T 322 can make adjustments to compensate for the low frequencies.

In some embodiments, determining T 322 may be based on a user profile. For example, a user may indicate personalized listening preferences, such as levels for various frequency ranges, and T 322 may be based on user preferences. These embodiments may involve receiving, via a display component of the device, a user indication of the user profile. These embodiments may also involve determining the user profile based on a history of user preferences. For example, controller 170 may analyze the history of user preferences to determine different values for T 322 based on, for example, a type of environment, a type of audio, a genre of music, a media playback application, and so forth.

In some embodiments, determining the target output signal includes determining a value offset for an audio output associated with the device. For example, different devices may be configured with different audio processing capabilities, different audio output components (e.g., location on the device, energy output for speakers, etc.), different media playback options, and so forth. Accordingly, a baseline signal output can be determined, and a value offset can be added to the target output signal to offset detrimental effects based on device configurations.

In some embodiments, based on D 320 and T 322, a correction (C) 324 can be determined as follows:

$$C_{dB} = T_{dB} - D_{dB} \quad \text{(Eqn. 2)}$$

Upon determination of C 324, DPE parameters 326 can be determined, and new coefficients 330 can be generated. In instances where the operations are performed iteratively, previous coefficients 328 (e.g., based on DPE coefficients from a previous iteration) can be updated to determine the DPE parameters 326. Generally, DPE parameters 326 can include parameters of a configuration, such as, for example, a number of frequency bands, a frequency cutoff for various frequency bands, and so forth. Coefficients (e.g., previous coefficients 328, new coefficients 330) generally refer to real-time values that are used for a calibration of the streaming media content. Generally, based on experimental results, changes to DPE parameters 326 may be applied in a range [−30 dB: +30 dB]. Also, for example, for low frequencies, changes to DPE parameters 326 may be applied in a range [−10 dB: +10 dB]. In general, different ranges for various frequency bands may be specified during a factory calibration for a device.

FIG. 3B illustrates a table 300B with example values for signal processing for dynamic adaptive audio, in accordance with example embodiments. Table 300B comprises six columns, C1, C2, . . . , C6, and eleven rows, R1, R2, . . . , R11. First column C1 displays eleven frequency bands, such as 0-150 Hz, 150-300 Hz, and so forth. Each frequency band has a frequency cutoff. For example, the frequency band 0-150 Hz has a cutoff of 150 Hz. Second column C2 displays example values for mic spectral average (e.g., mic spectral average 318) in each frequency band. Third column C3 displays example values for playback spectral average (e.g., playback spectral average 306) in each frequency band. Fourth column C4 displays example values for spectral shape difference (e.g., spectral shape difference 320) in each frequency band; fifth column C5 displays example values for a correction (e.g., correction 324) in each frequency band; and sixth column C6 displays example values for DPE parameters (e.g., DPE parameters 326) in each frequency band.

Each row, R1, R2, . . . , R11 corresponds to a frequency band. For example, first row R1 displays example values corresponding to a frequency band of 0-150 Hz. For example, with reference to first row R1, mic spectral average is −11.431 dB, playback spectral average is 34.755 dB, spectral shape difference is 16.240 dB, correction is 1.367 dB, and the DPE parameter is 1.000 dB. Accordingly, DPE 308 would calibrate the second portion of streaming media content by applying an adjustment of +1 dB in the frequency band of 0-150 Hz.

As another example, with reference to first row R4, mic spectral average is −5.939 dB, playback spectral average is 25.292 dB, spectral shape difference is 0.501 dB, correction is 1.091 dB, and the DPE parameter is 1.000 dB. Accordingly, DPE 308 would calibrate the second portion of streaming media content by applying an adjustment of +1 dB in the frequency band of 500-1000 Hz.

Referring again to FIG. 3A, new coefficients 330 are provided to DPE 308, and a second portion of streaming media content 302 can be modified by DPE 308. For example, energy corresponding to a frequency band may be suppressed when streaming media content is played into environment 312. Accordingly, new coefficients 330 are determined to offset this environmental effect. DPE 308 may then provide additional energy to the affected frequency band, and/or lower energy levels for other frequency bands, to offset the detected deficiency.

In some example implementations, updating DPE parameters 326 may introduce a lag time to audio playback. For example, if correction 324 is computed for each band, and is determined to be positive or negative with a small delta (e.g., 0.2 dB), and DPE coefficients are updated by such a delta each time, the computation may take at or about 100 milliseconds (ms). Accordingly, a change of 30 dBs would take about 30/0.2=150 steps, or 150×100 ms=15 seconds.

Referring now to FIG. 2, mic offset (O) 218 can be inferred from R 318, P 306, and C 324 as follows:

$$R = P + C + O \qquad (\text{Eqn. 3})$$

$$O = R - (P + C) \qquad (\text{Eqn. 4})$$

Referring now to FIG. 3A, DPE 308 can be run as part of an operating system of a device. Accordingly, DPE 308 can be configured to have secure access to one or more applications installed on the device, including one or more media playback applications. Generally, individual applications do not have access to audio playback capabilities of a device. Also, developers are unable to access various audio paths within the device due to security restrictions. Accordingly, DPE 308 can perform global operations and act as an intermediary between the one or more media playback applications and other device components, such as, for example, an audio output component, and audio input component, and so forth. DPE 308 can also apply adjustments globally to streaming media content from more than one media playback application. Also, the one or more media playback applications do not have access to data and/or information corresponding to adjustments to streaming media content applied by DPE 308, thereby enhancing security of the operating system of the device.

Figure 4:
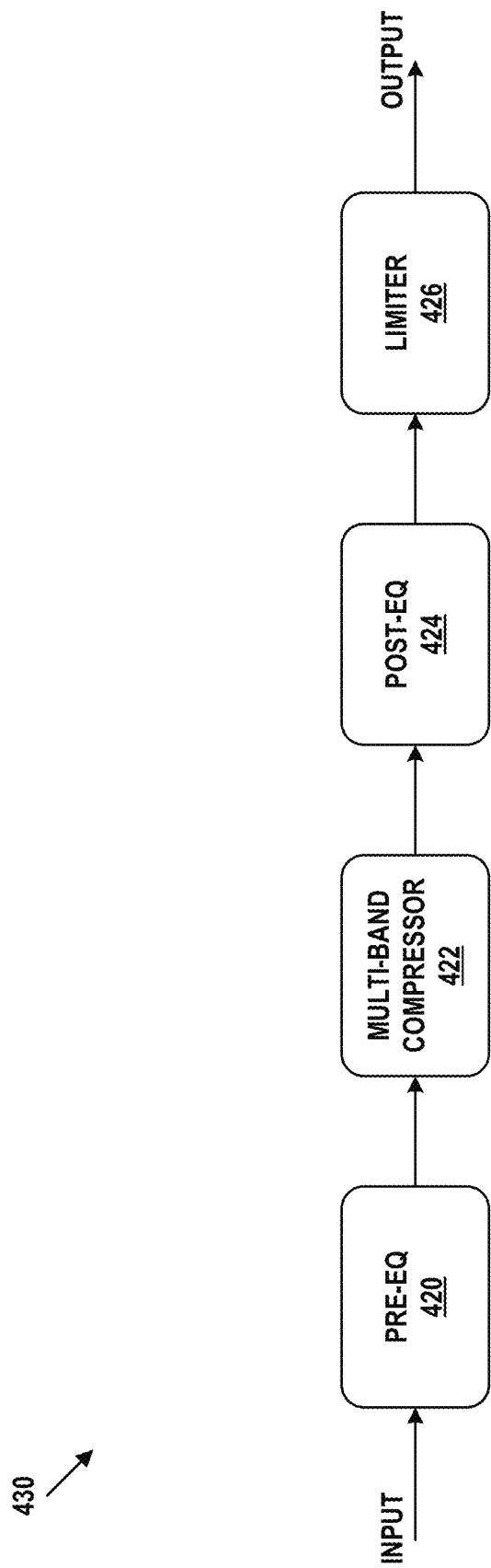
FIG. 4 illustrates a sample adaptive audio processing architecture, in accordance with example embodiments.

FIG. 4 illustrates a sample audio processing architecture, in accordance with example embodiments. Adaptive audio processing architecture 430 may be, for example, DPE 308, and may be built in an operating system of the computing device. Adaptive audio processing architecture 430 may include a number of audio channels (e.g., K audio channels). Each audio channel may include successive audio stages. The successive audio stages may include an InputGain stage (not shown in FIG. 4), a pre-equalization (Pre-EQ) stage 420, a multi-band compressor (MBC) stage 422, a post-equalization (Post-EQ) stage 424, and a limiter stage 426.

Pre-EQ stage 420 may allow developers of applications to programmatically adjust the audio frequency, for example, from 20 Hz to 20 kHz. Pre-EQ stage 420 may additionally allow developers to adjust the balance between different frequency components present within an audio signal. MBC stage 422 may lower the loud sounds while boosting the quiet sounds without distorting the characteristics of the original audio input. Post-EQ stage 424 may fine tune the sound before the limiter stage, allowing for further adjustments to the balance between different frequency components present within the audio signal generated by MBC 422. Limiter stage 426 may prevent additional gain above a certain threshold to protect the output audio from being loud and disruptive. That is, limiter 426 may help avoid saturation, and thus distortion, of the audio signal.

In some embodiments, the InputGain stage and Pre-EQ stage 420 may be combined into one stage. The audio data may be input successively to the InputGain stage, Pre-EQ stage 420, MBC stage 422, Post-EQ stage 424, and limiter stage 426. Adaptive audio processing architecture 430 provides EQ stages (e.g., Pre-EQ 420 and Post-EQ 424) before and after MBC stage 422 to allow a wide range of audio processing effects for applications. Each stage in the successive audio stages may be enabled or disabled (e.g., turned on/off). For example, an enabled stage modifies the audio signal according to parameters set by an application, and a disable stage lets the audio signal pass-through. Providing flexibility of turning on/off the individual stage may allow adaptive audio processing architecture 430 to be utilized by a variety of applications.

Figure 5:
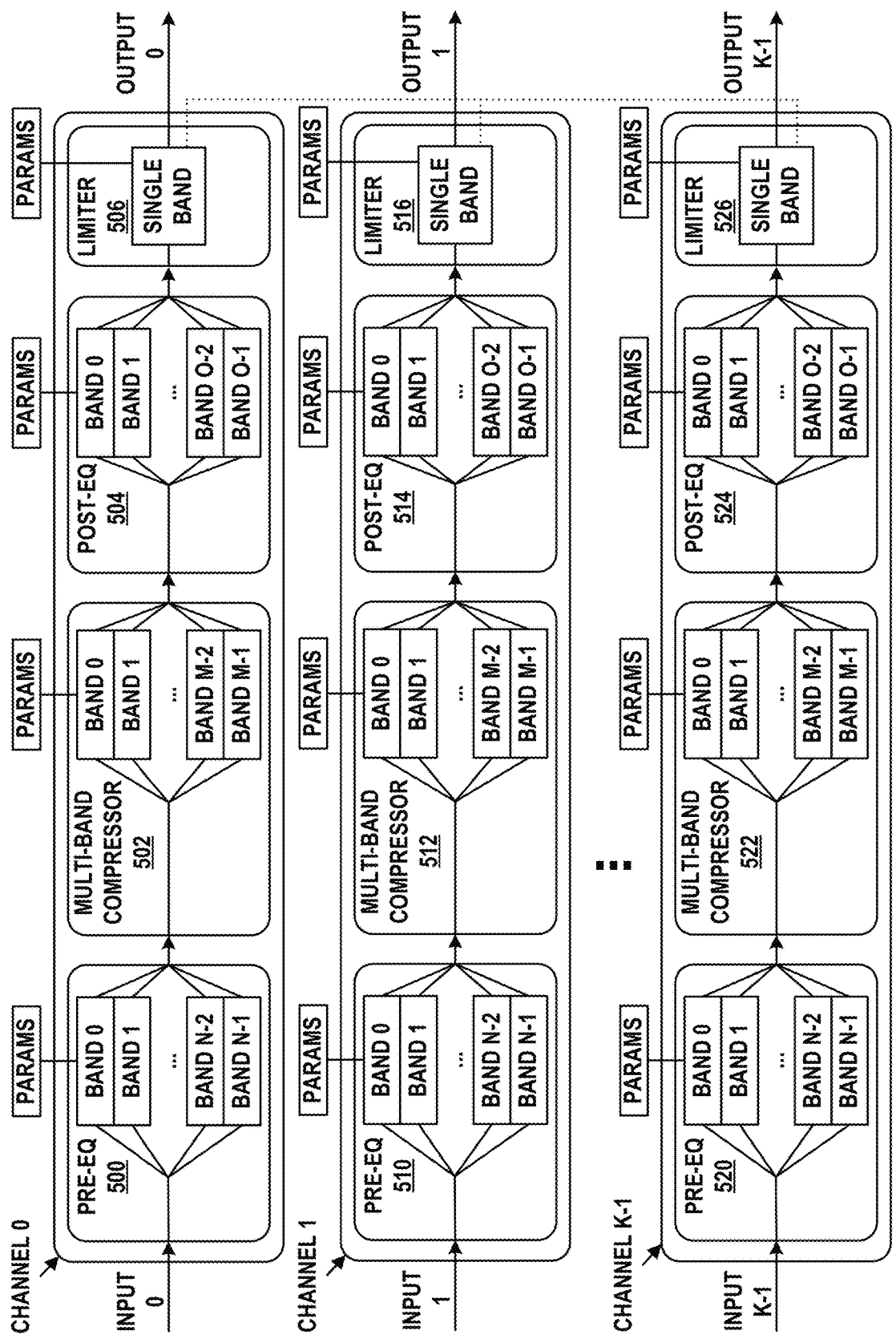
FIG. 5 illustrates a sample adaptive audio processing architecture, in accordance with example embodiments.

FIG. 5 illustrates a sample adaptive audio processing architecture, in accordance with example embodiments. Notably, the adaptive audio processing architecture of FIG. 5 includes multiple instantiations of architecture 430 shown in FIG. 4, thus forming multiple audio channels. The adaptive audio processing architecture may be built or implemented in or as part of the operating system and may include a number of audio channels (e.g., Channel 0 and Channel 1 through Channel K−1) that receive audio inputs (e.g., Input 0 and Input 1 through Input K−1) from, for example, one audio source (e.g., a multi-channel audio source).

Each audio channel may include the successive audio stages illustrated in FIG. 4. Namely, Channel 0 includes pre-EQ 500, MBC 502, post-EQ 504, and limiter 506, Channel 1 includes pre-EQ 510, MBC 512, post-EQ 514, and limiter 516, and Channel K−1 includes pre-EQ 520, MBC 522, post-EQ 524, and limiter 526. The audio data is output (e.g., Output 0 and Output 1 through Output K−1) from the audio channel after being processed through the successive audio stages. Generally, a channel average may be determined by averaging Output 0 and Output 1 through Output K−1.

Each of the Pre EQ, MBC, and Post EQ stages may support a number of bands (e.g., Band 0, Band 1, Band M−2, Band M−1). Each channel and each stage in the channel may be configured based on parameters set, for example, DPE 308. In one or more implementations, all the parameters may be changed at runtime, or only some (or none) of the parameters might be changed at runtime. Additionally, each channel and/or each stage thereof may be modifiable independently of other channels and stages. In one example, the number of bands N in the pre-EQ stage may be independently modifiable for each of Channels 0 and 1 through K−1. That is, each of pre-EQ 500, 510, and 520 may be assigned a different value for N using the parameters. Similarly, the number of bands M for the MBC stages and the number of bands O for the post-EQ stages may be independently modifiable for each channel by way of the parameters. Alternatively, in another example, the number of bands N in the pre-EQ stage may be the same for each of Channels 0 and 1 through K−1. That is, each of pre-EQ 500, 510, and 520 may be assigned the same value for N using the parameters. Similarly, the number of bands M for the MBC stages and the number of bands O for the post-EQ stages may be the same for each channel. Notably, the numbers of bands N, M, and O may each be assigned different values independently of one another.

Generally, DPE parameters 326 do not have to be determined continuously. Such determination may be triggered by one or more triggering events. For example, the triggering may be performed in response to a movement detection. Motion sensors (e.g., an accelerometer) may detect a movement of the device, and upon a determination that a movement measurement exceeds a threshold value, controller 170 can trigger determination of correction 324. For example, movement measurement may indicate that the device has moved from an indoor environment to an outdoor environment. As another example, movement measurement may indicate that the device has moved from an outdoor environment (e.g., a grocery store) to an indoor environment (e.g., a car). Also, for example, movement measurement may indicate that the device has moved from one room (e.g., dining room) to another (e.g., bedroom). As another example, movement measurement may indicate that the device has moved from one type of surface to another. For example, the device may be initially placed on a soft surface (e.g., a sofa), and then moved to a harder surface (e.g., a table, a countertop, etc.).

In some embodiments, the triggering may be based on a change in the streaming media content. For example, a change in a type of streaming media content (e.g., from speech to music, background noise, etc.) can act as a triggering event. Also, for example, a change in a genre of music (e.g., classical, rock, blues, jazz, etc.) can act as a triggering event. In some embodiments, a new song can act as a triggering event (e.g., when a second song begins to play after a first song has been played). Also, for example, a change in the media playback application can act as a triggering event. In some instances, a user may change a level of output volume, and such a change in volume may act as a triggering event. Also, for example, controller 170 may determine that the device has not moved. This may indicate that environment 312 remains unchanged. Accordingly, absent other triggering events, controller 170 may determine not to cause DPE 308 to determine new coefficients 330.

In some embodiments, the triggering may be based on an amount of elapsed time since a prior calibration was performed. For example, correction 324 may be performed every five (5) minutes. Accordingly, controller 170 may determine that five minutes have elapsed since the last calibration, and trigger performance of a correction. Also, for example, correction 324 may be performed every day.

In some embodiments, the audio output component may include a plurality of speakers. In some instances, a speaker may not be active. For example, a speaker may be defective, or may be covered (e.g., by an object), and so forth. Accordingly, one or more active speakers of the plurality of speakers may be detected, and the calibrating may be performed to play the second portion of the streaming media content from the one or more active speakers. For example, DPE 308 may be triggered to determine new coefficients 330.

Some embodiments involve determining a type of the environment. Such embodiments involve determining not to perform the calibration based on the type of the environment. For example, if environment 312 is very loud, then an adjustment of the streaming media content may not enhance user experience. Accordingly, controller 170 may determine not to cause DPE 308 to determine new coefficients 330.

Generally, performing audio processing and determining DPE parameters 326 may consume power. Accordingly, in order to conserve battery power, some embodiments involve determining a level of available battery power. In such embodiments, upon a determination that the power level is below a threshold, controller 170 may determine not to cause DPE 308 to determine new coefficients 330.

Different types of environments may be associated with different acoustic signatures. For example, a small room may have an acoustic signature different from a large room. Also, for example, factors such as a material of the wall, carpeting, upholstery, amount of furniture, and so forth, may have different acoustic effects (e.g., due to reflection of sound waves, absorption of sound waves, etc.) on streaming media content that is played. Accordingly, some embodiments involve determining, for a location, a location profile based on an acoustic signature of the device in an environment in the location. For example, a user may frequently visit different rooms, offices, take public transportation, drive a personal automobile, and so forth. Each such environment may be associated with a corresponding location profile. In some embodiments, controller 170 may determine to cause, or not to cause, DPE 308 to determine new coefficients 330 based on the location profile.

In instances where the audio output component (e.g., audio output component 120, speaker 210, and/or speaker(s) 310) are not a part of the device that hosts the media playback application, the audio processing techniques described herein can calibrate dynamically to a location of such audio output component and/or the environment in which the audio output component is located. Such calibration can be performed in a background without the need for a test tone, and while a user is listening to streaming media content being played. Also, for example, the calibration can be triggered by changes to the environment and/or an arrangement of the audio output component. Also, additional hardware in the form of microphones (e.g., that are external to the device that hosts the media playback application) is not required. Moreover, the calibration can be triggered and performed without user initiation, input, and so forth, and without interrupting the user's experience of the streaming media content.

In some embodiments, the processes described with respect to FIG. 2 or FIG. 3A may be performed iteratively. For example, DPE 308 may adjust streaming media content 302 based on a first set of coefficients, and the modified content may be played into environment 312. Mics 314 may capture the streaming media content as played, and new coefficients 330 may be determined. DPE 308 may adjust streaming media content 302 based on new coefficients 330, and the modified content may be played into environment 312. This process may be iteratively repeated. For example, the process may be iteratively repeated until correction 324 is within a threshold of target selection, T, 322.

In some embodiments, a timing for calibration may be set by a user in user preferences. In some examples, a user may indicate a preference for a calibration time, such as, for example, at the beginning of a new media content, at a time a media playback application is changed, every hour (e.g., to check for potential changes in an environment), and so forth. Accordingly, some embodiments may involve receiving, via a display component of the device, a user indication to trigger a calibration. The triggering may be performed in response to the user indication. In some existing implementations, user preferences for different types of audio, audio for different media, audio for different environments, audio for different devices, and so forth, may be post-processed in a studio to have enhanced dynamic range and equalization depending on the distribution media. However, as described herein, with the adaptive audio processing architecture capable of being applied on a high resolution audio file, dynamic ranges and equalization may be adapted to different outputs on the computing device in real-time, to play back the audio file. In some embodiments, the dynamic ranges and equalization may be saved for further playback of the audio file. For example, a metadata of the audio file can be updated with values for dynamic ranges and equalization, and such values can be applied during a later playback of the audio file.

In some implementations, algorithms to help enhance hearing of a user may be adapted to the adaptive audio processing architecture. Using the configurable bands and multi-band compressor along with EQ for compensation, many types of hearing enhancing algorithms may be implemented. Similar configuration may be used in the adaptive audio processing architecture for use of personal sound amplifiers. That is, various audio processing algorithms/processes may be generated that are similar to those provided by hearing aids or other sound amplifiers.

In some implementations, algorithms to adapt the output level to a target level to compensate for loudness may be implemented with the dynamics audio processing effects of the subject technology.

IV. Example User Interfaces

Figure 6:
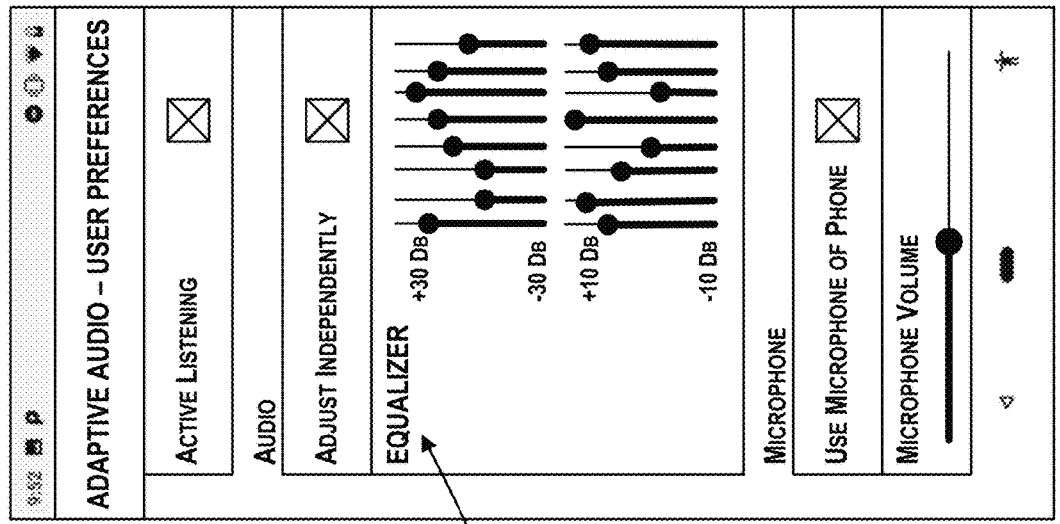
FIG. 6 illustrates sample user interface screens, in accordance with example embodiments.
Figure 6:
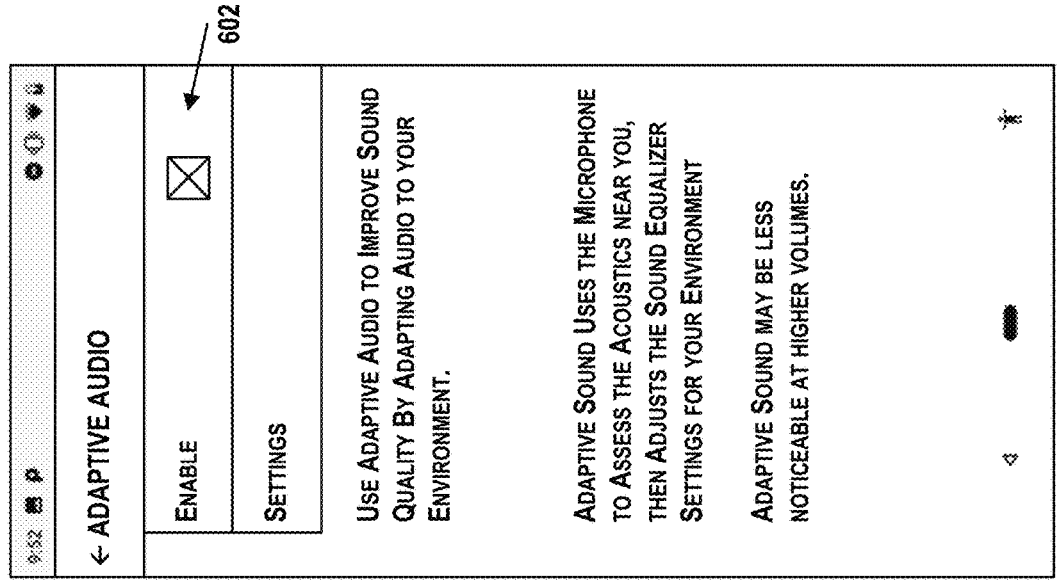

FIG. 6 illustrates sample user interface screens 600 and 604, in accordance with example embodiments.

User interface screen 600 may present a user with an ability to enable or disable adaptive audio processing. User interface 604 may present the user with various settings to adjust audio playback preferences. For example, adaptive audio processing architecture can allow an application to individually set parameters for each channel (e.g., audio channel for left ear and audio channel for right ear), or each frequency band, to enhance or compensate the audio experience of the user by dynamically adjusting to the environment.

The adaptive audio processing architecture may allow real-time microphone input for picking up and modifying sound from the immediate environment of the computing device. Specifically, an application called, for example, "Adaptive Sound" may be used to improve the sound. As illustrated in UI 600, this application may be enabled by way of a "Settings" menu provided by the operating system. Namely, the operating system may provide UI 600, allowing the user to enable the "Adaptive Sound" application/service by way of UI icon 602 (e.g., by selecting the checkbox therein).

Enabling the "Adaptive Sound" service by way of UI icon 602 may cause the operating system to provide UI 604 by way of which parameters of the service may be adjusted. Namely, service UI screen 604 provided by the service may be provided with sliders to adjust an audio equalizer 606 (e.g., sliders for various frequency levels, including a loudness slider and a tuning slider) that represent the parameters in simplified form, and offer intuitive manipulation of the parameters to achieve the audio signal processing effect that satisfy the users of the computing device. For example, users may be able to input preferences for audio in the range [−30 dB: +30 dB], and/or [−10 dB: +10 dB].

V. Example Network Environment

Figure 7:
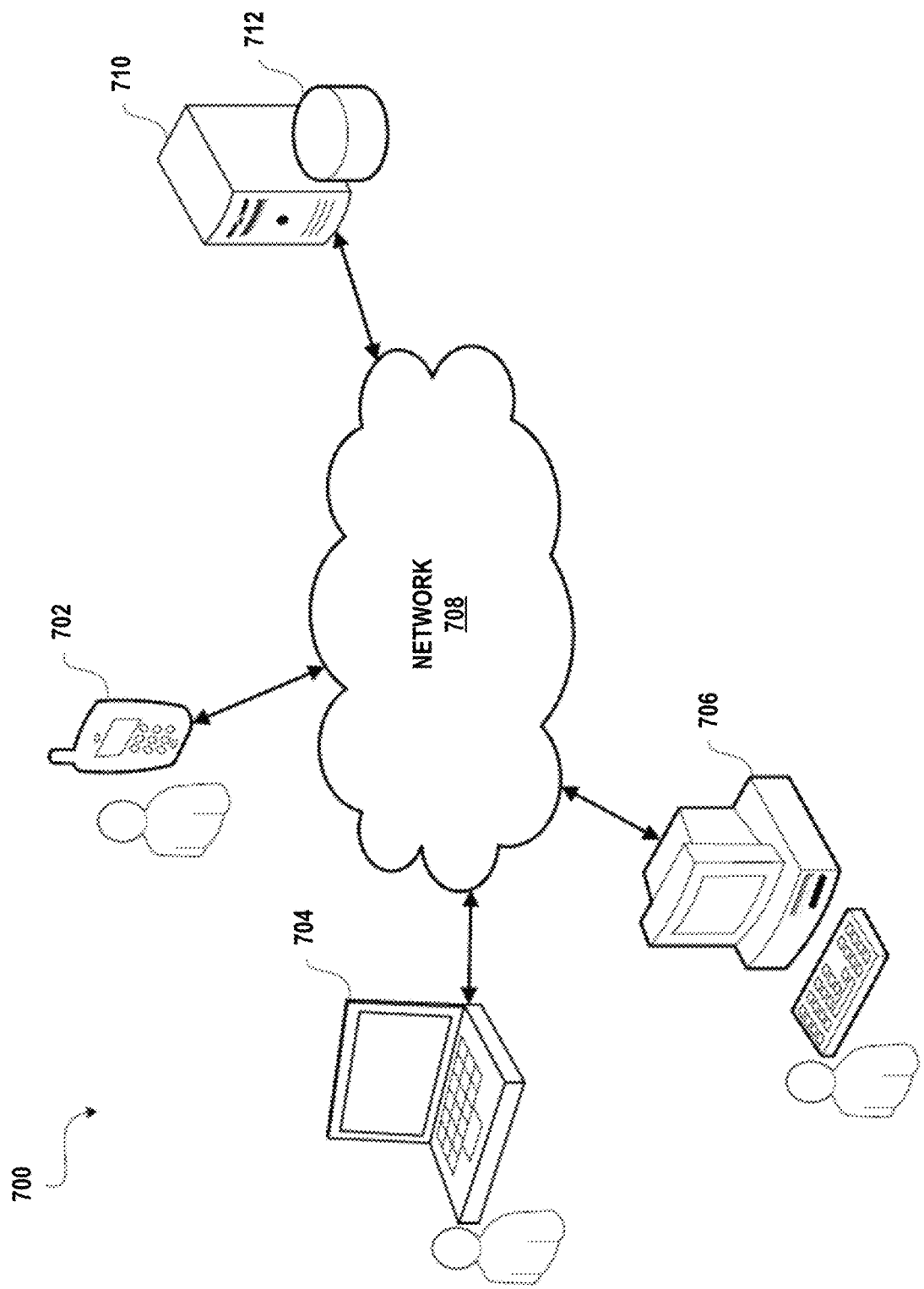
FIG. 7 illustrates an example network environment for dynamic adaptive audio, in accordance with example embodiments.

FIG. 7 illustrates example network environment 700 for dynamic adaptive audio, in accordance with example embodiments. The network environment 700 includes computing devices 702, 704, and 706, server 710, and storage 712. In some aspects, the network environment 700 can have more or fewer computing devices (e.g., 702-706) and/or server (e.g., 710) than those shown in FIG. 7.

Each of the computing devices 702, 704, and 706 can represent various forms of processing devices that have a processor, a memory, and communications capability. The computing devices 702, 704, and 706 may communicate with each other, with the server 710, and/or with other systems and devices not shown in FIG. 7. By way of non-limiting example, processing devices can include a desktop computer, a laptop computer, a handheld computer, a personal digital assistant (PDA), a cellular telephone, a network appliance, a camera, a smart phone, an enhanced general packet radio service (EGPRS) mobile phone, a media player, a navigation device, an email device, a game console, a wired/wireless headphone/headset, a wearable device, a wireless or wired speaker(s), or a combination of any of these processing devices or other processing devices.

Each of the computing devices 702, 704, and 706 may be configured with built-in dynamic adaptive audio processing architecture for achieving desirable audio signal processing effects. For example, a media playback application may be installed on the computing devices 702, 704, and 706 as a client application. The computing devices 702, 704, and 706 may be associated with a single user. Preferred audio parameters set for the dynamic adaptive audio processing architecture may be transmitted to and received from server 710 via network 708. Also, for example, each of the computing devices 702, 704, and 706 may include one or more microphones, one or more speakers, one or more sensors (e.g., an accelerometer, a gyroscope), a transducer, and so forth.

The network 708 can be a computer network such as, for example, a local area network (LAN), wide area network (WAN), the Internet, a cellular network, or a combination thereof connecting any number of mobile clients, fixed clients, and servers. Further, the network 708 can include, but is not limited to, any one or more of the following network topologies, including a bus network, a star network, a ring network, a mesh network, a star-bus network, tree or hierarchical network, and the like. In some aspects, communication between each client (e.g., computing devices 702, 704, and 706) and server (e.g., server 710) can occur via a virtual private network (VPN), Secure Shell (SSH) tunnel, Secure Socket Layer (SSL) communication, or other secure network connection. In some aspects, network 708 may further include a corporate network (e.g., intranet) and one or more wireless access points.

Server 710 may represent a single computing device such as a computer server that includes a processor and a memory. The processor may execute computer instructions stored in memory. The server 710 is configured to communicate with client applications (e.g., applications) on client devices (e.g., the computing devices 702, 704, and 706) via the network 708. For example, the server 710 may transmit the preferred audio parameters received from the computing device 702 to the computing device 706 when the user switches the device from the computing device 702 to the computing device 706. In one or more implementations, the computing device 702, the computing device 704, the computing device 706, or the server 710 may be, or may include all or part of, computing device 100 components that are discussed with respect to FIG. 1.

For example, the preferred parameters may be associated with a user profile (e.g., user of the computing device 702, 704, or 706) or a device profile (e.g., computing device 702, 704, or 706). The preferred parameters associated with a user profile may be shared among various devices (e.g., computing device 702, 704, or 706) used by the user. For example, when the user switches from the first device (e.g., computing device 702) to the second device (e.g., computing device 706), the preferred parameters for a music playing application on the first device (e.g., computing device 702) may be shared from the second device (e.g., computing device 706) if the second device has the music playing application installed. In some embodiments, the preferred parameters may be shared via the server 710. The preferred parameters associated with a device (e.g., computing device 704) profile may be applied globally to media playback applications installed on the computing device (e.g., computing device 704).

To the extent that the systems discussed herein collect personal information about users, or may make use of personal information, the users may be provided with an opportunity to control whether programs or features collect user information (e.g., information about a user's contacts, a user's preferences, or a user's current location). The users may also be provided with options to turn on or turn off certain features or functions provided by the systems. In addition, certain data may be treated in one or more ways before it is stored or used, so that personally identifiable information is removed. For example, a user's identity may be treated so that no personally identifiable information can be determined for the user, or a user's geographic location may be generalized where location information is obtained (such as to a city, zip code, or state level), so that a particular location of a user cannot be determined. Thus, the user may have control over how information is collected about the user and used by the systems.

VI. Training Machine Learning Models for Generating Inferences/Predictions

Figure 8:
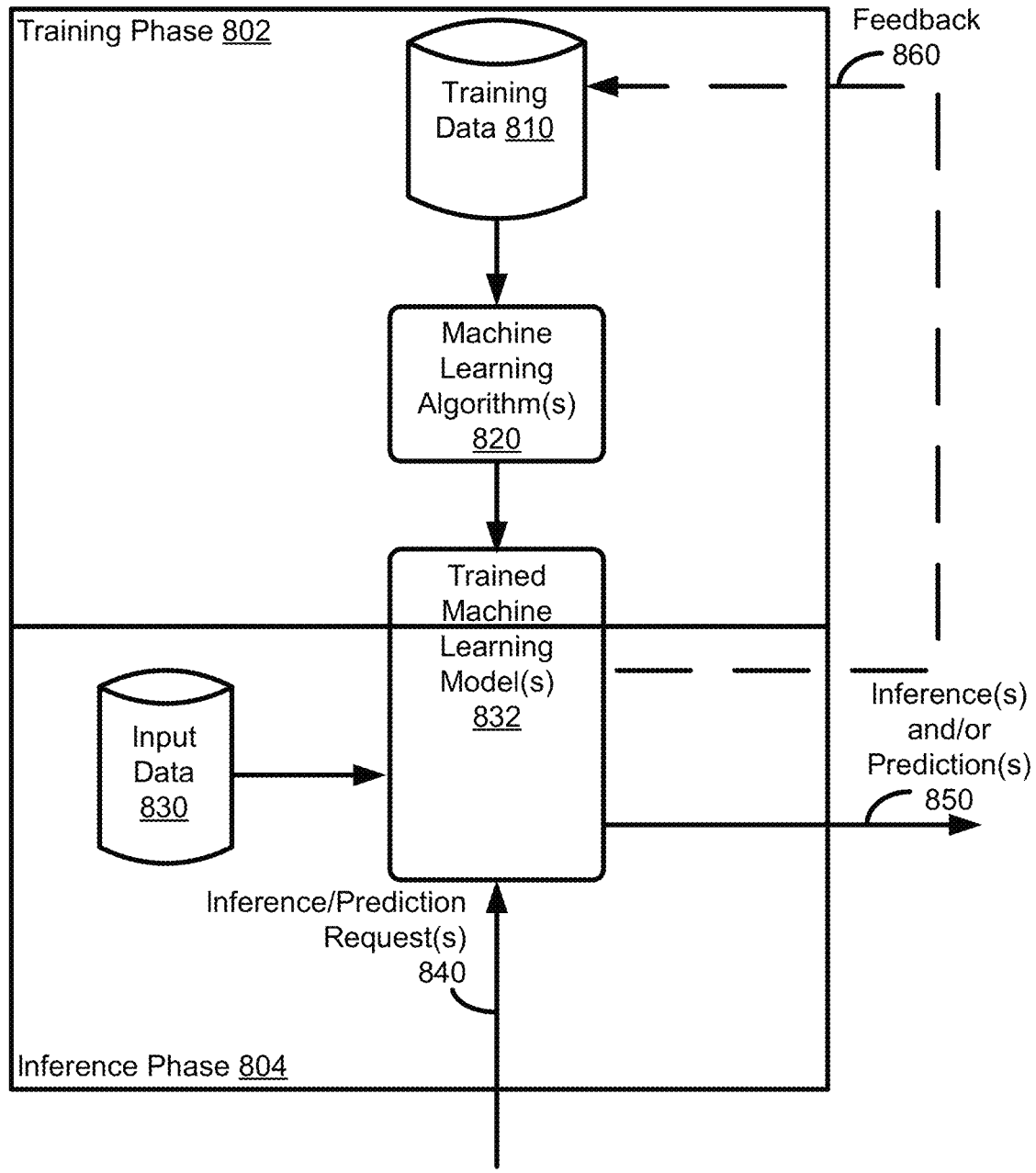
FIG. 8 is a diagram illustrating training and inference phases of a machine learning model, in accordance with example embodiments.

FIG. 8 shows diagram 800 illustrating a training phase 802 and an inference phase 804 of trained machine learning model(s) 832, in accordance with example embodiments. Some machine learning techniques involve training one or more machine learning algorithms, on an input set of training data to recognize patterns in the training data and provide output inferences and/or predictions about (patterns in the) training data. The resulting trained machine learning algorithm can be termed as a trained machine learning model. For example, FIG. 8 shows training phase 802 where one or more machine learning algorithms 820 are being trained on training data 810 to become trained machine learning model 832. Then, during inference phase 804, trained machine learning model 832 can receive input data 830 and one or more inference/prediction requests 840 (perhaps as part of input data 830) and responsively provide as an output one or more inferences and/or predictions 850.

As such, trained machine learning model(s) 832 can include one or more models of one or more machine learning algorithms 820. Machine learning algorithm(s) 820 may include, but are not limited to: an artificial neural network (e.g., a convolutional neural networks, a recurrent neural network, a Bayesian network, a hidden Markov model, a Markov decision process, a logistic regression function, a support vector machine, a suitable statistical machine learning algorithm, and/or a heuristic machine learning system). Machine learning algorithm(s) 820 may be supervised or unsupervised, and may implement any suitable combination of online and offline learning.

In some examples, machine learning algorithm(s) 820 and/or trained machine learning model(s) 832 can be accelerated using on-device coprocessors, such as graphic processing units (GPUs), tensor processing units (TPUs), digital signal processors (DSPs), and/or application specific integrated circuits (ASICs). Such on-device coprocessors can be used to speed up machine learning algorithm(s) 820 and/or trained machine learning model(s) 832. In some examples, trained machine learning model(s) 832 can be trained, reside and execute to provide inferences on a particular computing device, and/or otherwise can make inferences for the particular computing device.

During training phase 802, machine learning algorithm(s) 820 can be trained by providing at least training data 810 as training input using unsupervised, supervised, semi-supervised, and/or reinforcement learning techniques. Unsupervised learning involves providing a portion (or all) of training data 810 to machine learning algorithm(s) 820 and machine learning algorithm(s) 820 determining one or more output inferences based on the provided portion (or all) of training data 810. Supervised learning involves providing a portion of training data 810 to machine learning algorithm(s) 820, with machine learning algorithm(s) 820 determining one or more output inferences based on the provided portion of training data 810, and the output inference(s) are either accepted or corrected based on correct results associated with training data 810. In some examples, supervised learning of machine learning algorithm(s) 820 can be governed by a set of rules and/or a set of labels for the training input, and the set of rules and/or set of labels may be used to correct inferences of machine learning algorithm(s) 820.

Semi-supervised learning involves having correct results for part, but not all, of training data 810. During semi-supervised learning, supervised learning is used for a portion of training data 810 having correct results, and unsupervised learning is used for a portion of training data 810 not having correct results. Reinforcement learning involves machine learning algorithm(s) 820 receiving a reward signal regarding a prior inference, where the reward signal can be a numerical value. During reinforcement learning, machine learning algorithm(s) 820 can output an inference and receive a reward signal in response, where machine learning algorithm(s) 820 are configured to try to maximize the numerical value of the reward signal. In some examples, reinforcement learning also utilizes a value function that provides a numerical value representing an expected total of the numerical values provided by the reward signal over time. In some examples, machine learning algorithm(s) 820 and/or trained machine learning model(s) 832 can be trained using other machine learning techniques, including but not limited to, incremental learning and curriculum learning.

In some examples, machine learning algorithm(s) 820 and/or trained machine learning model(s) 832 can use transfer learning techniques. For example, transfer learning techniques can involve trained machine learning model(s) 832 being pre-trained on one set of data and additionally trained using training data 810. More particularly, machine learning algorithm(s) 820 can be pre-trained on data from one or more computing devices and a resulting trained machine learning model provided to a particular computing device, where the particular computing device is intended to execute the trained machine learning model during inference phase 804. Then, during training phase 802, the pre-trained machine learning model can be additionally trained using training data 810, where training data 810 can be derived from kernel and non-kernel data of the particular computing device. This further training of the machine learning algorithm(s) 820 and/or the pre-trained machine learning model using training data 810 of the particular computing device's data can be performed using either supervised or unsupervised learning. Once machine learning algorithm(s) 820 and/or the pre-trained machine learning model has been trained on at least training data 810, training phase 802 can be completed. The trained resulting machine learning model can be utilized as at least one of trained machine learning model(s) 832.

In particular, once training phase 802 has been completed, trained machine learning model(s) 832 can be provided to a computing device, if not already on the computing device. Inference phase 804 can begin after trained machine learning model(s) 832 are provided to the particular computing device.

During inference phase 804, trained machine learning model(s) 832 can receive input data 830 and generate and output one or more corresponding inferences and/or predictions 850 about input data 830. As such, input data 830 can be used as an input to trained machine learning model(s) 832 for providing corresponding inference(s) and/or prediction(s) 850 to kernel components and non-kernel components. For example, trained machine learning model(s) 832 can generate inference(s) and/or prediction(s) 850 in response to one or more inference/prediction requests 840.

In some examples, trained machine learning model(s) 832 can be executed by a portion of other software. For example, trained machine learning model(s) 832 can be executed by an inference or prediction daemon to be readily available to provide inferences and/or predictions upon request. Input data 830 can include data from the particular computing device executing trained machine learning model(s) 832 and/or input data from one or more computing devices other than the particular computing device.

Input data 830 can include a plurality of audio signals captured in a plurality of environments. The plurality of audio signals can include a wide variety of streaming media content, such as different genres of music, different levels of sound optimizations, and so forth. Other types of input data are possible as well. In some embodiments, input data 830 can include a plurality of user preferences. The plurality of user preferences can be historical user data, and may also be based on a wide variety of streaming media content, such as different genres of music, different levels of sound optimizations, different settings for sound equalizers, volumes, and so forth. Also, for example, input data 830 can include a plurality of user preferences in a plurality of environments.

Inference(s) and/or prediction(s) 850 can include output digital audio signals, optimized versions of captured audio, user preferences for audio settings, corrected audio signal, and/or other output data produced by trained machine learning model(s) 832 operating on input data 830 (and training data 810). Trained machine learning model(s) 832 can also rely on past user preferences as inputs for generating new preferences, recommended preferences, and so forth. In some examples, trained machine learning model(s) 832 can use output inference(s) and/or prediction(s) 850 as input feedback 860. For example, output inference(s) and/or prediction(s) 850 may include a recommended audio setting (e.g., sound equalizer setting) in a particular environment, and input feedback 860 may correspond to user adjustments to the recommended setting.

Convolutional neural networks can be an example of machine learning algorithm(s) 820. After training, the trained version of convolutional neural networks, such as a tensor flow model, can be examples of trained machine learning model(s) 832. In this approach, an example of inference/prediction request(s) 840 can be a request to optimize a captured digital signal, and a corresponding example of inferences and/or prediction(s) 850 can be the output optimized signal. Another example of inference/prediction request(s) 840 can be a request to automatically respond to user preferences (e.g., generate an audio setting in a particular environment based at least in part on user preferences), and a corresponding example of inferences and/or prediction(s) 850 can be the output audio setting.

In some examples, a given computing device can include the trained version of convolutional neural networks, perhaps after training convolutional neural networks. Then, the given computing device can receive requests to optimize a captured digital signal, and use the trained version of convolutional neural networks to generate the output optimized signal. As another example, the given computing device can receive requests to optimize the between the one or more audio characteristics of the streaming media content and the one or more detected audio characteristics of the streaming media content, and use the trained version of convolutional neural networks to generate the output optimized signal. Also, for example, the given computing device can receive requests to automatically respond to user preferences, and use the trained version of convolutional neural networks to generate the output audio setting.

In some examples, two or more computing devices can be used to provide a desired output; e.g., a first computing device can generate and send requests to optimize a captured digital signal. Then, the second computing device can use the trained versions of convolutional neural networks, perhaps after training convolutional neural networks, to generate output optimized signal, and respond to the requests from the first computing device for the output optimized signal. Then, upon reception of responses to the requests, the first computing device can provide the requested output optimized signal prior to the determining of the difference between the one or more audio characteristics of the streaming media content and the one or more detected audio characteristics of the streaming media content.

Also, for example, a first computing device can generate and send requests to automatically respond to user preferences. Then, the second computing device can use the trained versions of convolutional neural networks, perhaps after training convolutional neural networks, to generate output audio setting, and respond to the requests from the first computing device for the output audio setting. Then, upon reception of responses to the requests, the first computing device can provide the requested automatic response to user preferences.

VII. Example Methods

Figure 9:
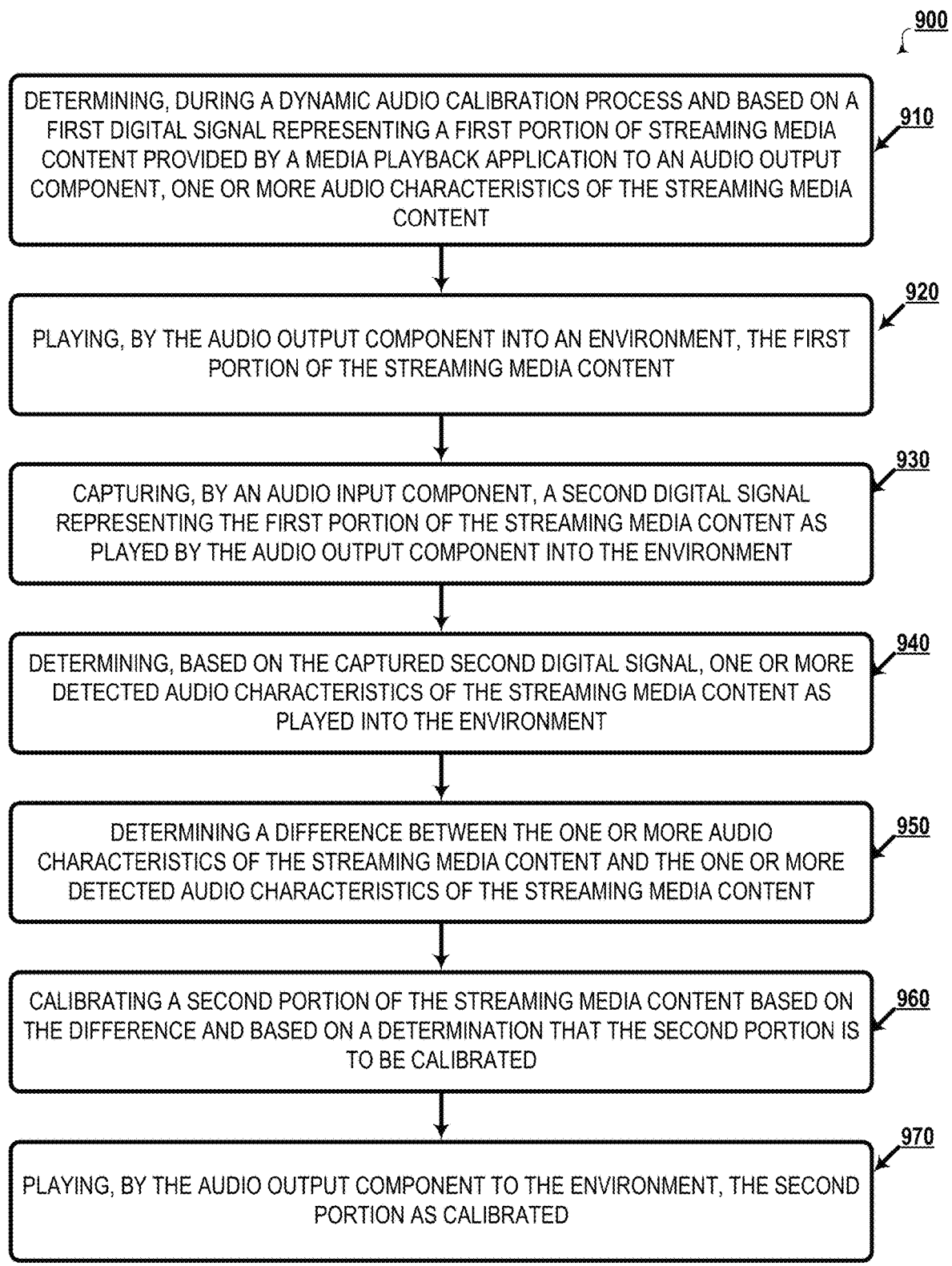
FIG. 9 illustrates a flow chart, in accordance with example embodiments.

FIG. 9 illustrates flow chart 900 of operations related to using audio processing stages provided by an operating system. The operations may be executed by and/or used with any of computing devices 100, 702-706, or other ones of the preceding example embodiments.

Block 910 involves determining, during a dynamic audio calibration process and based on a first digital signal representing a first portion of streaming media content provided by a media playback application to an audio output component, one or more audio characteristics of the streaming media content.

Block 920 involves playing, by the audio output component into an environment, the first portion of the streaming media content.

Block 930 involves capturing, by an audio input component, a second digital signal representing the first portion of the streaming media content as played by the audio output component into the environment.

Block 940 involves determining, based on the captured second digital signal, one or more detected audio characteristics of the streaming media content as played into the environment.

Block 950 involves determining a difference between the one or more audio characteristics of the streaming media content and the one or more detected audio characteristics of the streaming media content.

Block 960 involves calibrating a second portion of the streaming media content based on the difference and based on a determination that the second portion is to be calibrated.

Block 970 involves playing, by the audio output component to the environment, the second portion as calibrated.

Some embodiments involve determining a target output signal by determining a value offset for an audio output associated with the device, and wherein the calibrating of the second portion further involves calibrating the second portion to be within a threshold of the target output signal.

In some embodiments, determining the target output signal involves determining a value offset for an audio output associated with the device. These embodiments may involve playing, by the audio output component to a test environment of the device, a test signal. These embodiments may further involve capturing, by the audio input component, the test signal as played into the test environment. The value offset may be based on a difference between respective spectral shapes of the white-noise signal as played and the test signal as captured. In some embodiments, the test environment may be an acoustically neutral environment (e.g., a recording studio), a musical auditorium (e.g., a symphonic theater, a stadium, an operatic theater, or other live music venues). Some embodiments may involve playing, by the audio output component to an acoustically neutral environment of the device, a white-noise signal. These embodiments may further involve capturing, by the audio input component, the white-noise signal as played into the acoustically neutral environment. The value offset may be based on a difference between respective spectral shapes of the white-noise signal as played and the white-noise signal as captured.

Some embodiments may involve generating a test signal based on at least one of the environment, the device, or the media playback application. Such embodiments also involve playing, by the audio output component to the environment of the device, the test signal as generated. Such embodiments additionally involve capturing, by the audio input component, the test signal as played into the environment. The value offset may be based on a difference between respective spectral shapes of the test signal as played and the test signal as captured.

In some embodiments, determining the target output signal may be based on a user profile. The user profile may be based on a user indication via a display component of the device, or a history of user preferences, or both.

Some embodiments involve triggering the capturing of the second digital signal. These embodiments may involve detecting a movement of the device. The triggering may be performed in response to a determination that a movement measurement exceeds a threshold value. In some embodiments, the triggering may be based on one or more of: (i) a change in the streaming media content, (ii) an amount of elapsed time since a prior calibration was performed, or (iii) detecting a change from the media playback application to a second media playback application.

Some embodiments involve receiving, via a display component of the device, a user indication to calibrate. The triggering may be performed in response to the user indication. In some embodiments, the triggering may be performed upon detecting a change from the media playback application to a second media playback application.

In some embodiments, the audio output component may include a plurality of speakers. Such embodiments involve detecting one or more active speakers of the plurality of speakers. The calibrating of the second portion is performed to calibrate the second portion to be played from the one or more active speakers.

Some embodiments involve determining a type of the environment. Such embodiments involve determining not to perform the calibrating based on the type of the environment.

In some embodiments, the first and second digital signals may be based on an average of energy outputs over a range of audio frequencies.

In some embodiments, the device may include one or more media playback applications installed on the device, and the audio output controller may be configured to securely access streaming media content played by the one or more media playback applications.

Some embodiments involve determining a level of available power resources in a battery of the device. Such embodiments involve determining that the second portion of the streaming media content is not to be calibrated based on the level of the available power resources.

Some embodiments involve determining, for a location, a location profile based on an acoustic signature of the device in an environment in the location. In such embodiments, the calibrating of the second portion is performed based on the location profile.

Some embodiments involve iteratively performing steps of determining one or more additional audio characteristics of the streaming media content, playing a portion of the streaming media content, capturing a digital signal representing the streaming media content as played, determining one or more additional detected audio characteristics of the streaming media content, determining a difference between the one or more additional audio characteristics and the one or more additional detected audio characteristics, calibrating another portion of the streaming media content, and playing the calibrated portion, to enhance audio playback of the streaming media content.

In some embodiments, one or more of the audio output component or the audio input component is a part of the device, a part of a second device communicatively coupled to the device, or both.

In some embodiments, the audio input device may include a plurality of microphones in the environment. Such embodiments involve capturing the second digital signal by receiving, from the plurality of microphones, a plurality of signals. In such embodiments, the calibrating of the second portion is based on an aggregate of the plurality of signals.

Some embodiments involve determining the first digital signal as an aggregate of (1) the first portion of the streaming media content as output by the media playback application of one or more media playback applications, and (2) a first portion of a second streaming media content as output by a second media playback application of the one or more media playback applications. Such embodiments may involve, after determining the one or more audio characteristics of the streaming media content, playing, by the audio output component into the environment, respective first portions of the streaming media content and the second streaming media content. These embodiments may further involve capturing, by the audio input component, a third digital signal representing the respective first portions of the streaming media content and the second streaming media content as played into the environment. These embodiments may additionally involve calibrating, based on the third digital signal, respective second portions of the streaming media content and the second streaming media content. These embodiments may also involve playing, by the audio output component to the environment of the device, the respective second portions as calibrated.

Some embodiments involve applying a trained machine learning model to optimize the captured second digital signal prior to the determining of the difference between the one or more audio characteristics of the streaming media content and the one or more detected audio characteristics of the streaming media content.

Some embodiments involve applying a trained machine learning model to automatically respond to user preferences.

In some embodiments, the media playback application plays audio from an audio source file. The first digital signal represents the audio content of the audio source file.

Some embodiments involve providing the first portion of the streaming media content to the audio output component of the device after the determining of the first digital signal.

Some embodiments involve receiving the streaming media content from a third party content provider over a communications network.

In some embodiments, the operations for the determining of the one or more audio characteristics of the streaming media content further involve determining one or more artist-intended audio characteristics of the streaming media content by tapping into the first portion of the streaming media content, wherein the tapping occurs subsequent to the first portion being provided by the media playback application, and prior to the first portion being received by the audio output component.

In some embodiments, the operations for the calibrating of the second portion of the streaming media content based on the difference and based on a determination that the second portion is to be calibrated further involve applying the difference as an input to a machine learning model in order to determine an output audio setting.

In some embodiments, the operations for the playing of the second portion as calibrated further involve outputting the second portion using the audio output component and using the determined output audio setting. In some embodiments, the machine learning model is an artificial neural network.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, magnetic media, optical media, electronic media, etc. The computer readable media does not include carrier waves and electronic signals passing wirelessly or over wired connections.

In this specification, the term "software" is meant to include, for example, firmware residing in read-only memory or other form of electronic storage, or applications that may be stored in magnetic storage, optical, solid state, etc., which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

These functions described above can be implemented in digital electronic circuitry, in computer software, firmware, or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, for example, microprocessors, storage, and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic or solid state hard drives, read-only and recordable Blu-Ray® discs, ultra-density optical discs, any other optical or magnetic media, and floppy disks. The computer-readable media can store a computer program that is executable by at least one processing unit and includes sets of instructions for performing various operations. Examples of computer programs or computer code include machine code, for example, is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, for example, application specific integrated circuits (ASICs) or field programmable gate arrays (FPGAs). In some implementations, such integrated circuits execute instructions that are stored on the circuit itself.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device, e.g., a CRT or LCD monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of example approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, where reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

As used herein, the phrase "at least one of" preceding a series of items, with the term "and" or "or" to separate any of the items, modifies the list as a whole, rather than each member of the list (e.g., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include", "have", or the like is used in the description or the claims, such term is intended to be inclusive in a manner similar to the term "comprise" as "comprise" is interpreted when employed as a transitional word in a claim.

What is claimed is:

1. A device comprising:
    an audio output controller communicatively linked to:
    an audio output component,
    an audio input component, and
    one or more media playback applications; and
    one or more processors operable to perform operations, the operations comprising:
        determining, by the audio output controller during a dynamic audio calibration process and based on a first digital signal representing a first portion of streaming media content provided by a media playback application to the audio output component, one or more audio characteristics of the streaming media content;
        playing, by the audio output component into an environment, the first portion of the streaming media content;
        capturing, by the audio input component, a second digital signal representing the first portion of the streaming media content as played by the audio output component into the environment;
        determining, based on the captured second digital signal, one or more detected audio characteristics of the streaming media content as played into the environment;
        determining a difference between the one or more audio characteristics of the streaming media content and the one or more detected audio characteristics of the streaming media content;
        calibrating a second portion of the streaming media content based on the difference and based on a determination that the second portion is to be calibrated, wherein the calibrating comprises applying the difference as an input to a machine learning model in order to determine an output audio setting; and
        playing, by the audio output component to the environment, the second portion as calibrated.

2. The device of claim 1, the operations further comprising:
    determining a target output signal by determining a value offset for an audio output associated with the device, and wherein the calibrating of the second portion further comprising:
    calibrating the second portion to be within a threshold of the target output signal.

3. The device of claim 2, the operations further comprising:
    playing, by the audio output component to a test environment of the device, a test signal;
    capturing, by the audio input component, the test signal as played into the test environment, and
    wherein the value offset is based on a difference between respective spectral shapes of the test signal as played and the test signal as captured.

4. The device of claim 2, the operations further comprising:
    generating a test signal based on at least one of the environment, the device, or the media playback application;
    playing, by the audio output component to the environment of the device, the test signal as generated;
    capturing, by the audio input component, the test signal as played into the environment, and
    wherein the value offset is based on a difference between respective spectral shapes of the test signal as played and the test signal as captured.

5. The device of claim 2, wherein determining the target output signal is based on a user profile, wherein the user profile is based on a user indication via a display component of the device, or a history of user preferences, or both.

6. The device of claim 1, the operations further comprising:
    triggering the capturing of the second digital signal.

7. The device of claim 6, the operations further comprising:
    detecting a movement of the device, and
    wherein the triggering is performed in response to a determination that a movement measurement exceeds a threshold value.

8. The device of claim 6, wherein the triggering is based on one or more of: (i) a change in the streaming media content, (ii) an amount of elapsed time since a prior calibration was performed, or (iii) detecting a change from the media playback application to a second media playback application.

9. The device of claim 6, the operations further comprising:
receiving, via a display component of the device, a user indication to calibrate the second portion, and
wherein the triggering is performed in response to the user indication.

10. The device of claim 1, wherein the audio output component comprises a plurality of speakers, and the operations further comprising:
detecting one or more active speakers of the plurality of speakers, and
wherein the calibrating of the second portion is performed to calibrate the second portion to be played from the one or more active speakers.

11. The device of claim 1, the operations further comprising:
determining a type of the environment; and
determining that the second portion of the streaming media content is not to be calibrated based on the type of the environment.

12. The device of claim 1, wherein the first and second digital signals are based on an average of energy outputs over a range of audio frequencies.

13. The device of claim 1, wherein the device comprises one or more media playback applications installed on the device, and wherein the audio output controller is configured to securely access streaming media content played by the one or more media playback applications.

14. The device of claim 1, the operations further comprising:
determining a level of available power resources in a battery of the device; and
determining that the second portion of the streaming media content is not to be calibrated based on the level of the available power resources.

15. The device of claim 1, the operations further comprising:
determining, for a location, a location profile based on an acoustic signature of the device in a second environment, and
wherein the calibrating of the second portion is performed based on the location profile.

16. The device of claim 1, the operations further comprising:
iteratively performing steps of determining one or more additional audio characteristics of the streaming media content, playing a portion of the streaming media content, capturing a digital signal representing the streaming media content as played, determining one or more additional detected audio characteristics of the streaming media content, determining a difference between the one or more additional audio characteristics and the one or more additional detected audio characteristics, calibrating another portion of the streaming media content, and playing the calibrated portion, to enhance audio playback of the streaming media content.

17. The device of claim 1, wherein one or more of the audio output component or the audio input component is a part of the device, a part of a second device communicatively coupled to the device, or both.

18. The device of claim 1, wherein the audio input device comprises a plurality of microphones in the environment, and wherein the capturing of the second digital signal comprises receiving, from the plurality of microphones, a plurality of signals, and wherein the calibrating of the second portion is based on an aggregate of the plurality of signals.

19. The device of claim 1, the operations further comprising:
determining the first digital signal as an aggregate of (1) the first portion of the streaming media content as output by the media playback application of one or more media playback applications, and (2) a first portion of a second streaming media content as output by a second media playback application of the one or more media playback applications;
after determining the one or more audio characteristics of the streaming media content, playing, by the audio output component into the environment, respective first portions of the streaming media content and the second streaming media content;
capturing, by the audio input component, a third digital signal representing the respective first portions of the streaming media content and the second streaming media content as played into the environment;
calibrating, based on the third digital signal, respective second portions of the streaming media content and the second streaming media content; and
playing, by the audio output component to the environment of the device, the respective second portions as calibrated.

20. The device of claim 1, the operations further comprising:
applying a trained machine learning model to optimize the captured second digital signal prior to the determining of the difference between the one or more audio characteristics of the streaming media content and the one or more detected audio characteristics of the streaming media content.

21. The device of claim 1, the operations further comprising:
applying a trained machine learning model to automatically respond to user preferences.

22. The device of claim 1, wherein the media playback application plays audio from an audio source file, and wherein the first digital signal represents the audio content of the audio source file.

23. The device of claim 1, the operations further comprising:
determining the first digital signal representing the first portion of the streaming media content; and
providing the first portion of the streaming media content to the audio output component of the device after the determining of the first digital signal.

24. The device of claim 1, the operations further comprising:
receiving the streaming media content from a third party content provider over a communications network.

25. The device of claim 1, wherein the operations for the determining of the one or more audio characteristics of the streaming media content further comprises:
determining one or more artist-intended audio characteristics of the streaming media content by tapping into the first portion of the streaming media content, wherein the tapping occurs subsequent to the first portion being provided by the media playback application, and prior to the first portion being received by the audio output component.

26. The device of claim 1, wherein the operations for the playing of the second portion as calibrated further comprises: outputting the second portion using the audio output component and using the determined output audio setting.

27. The device of claim 26, wherein the machine learning model is an artificial neural network.

28. A computer-implemented method comprising:
determining, during a dynamic audio calibration process and based on a first digital signal representing a first portion of streaming media content provided by a media playback application to an audio output component, one or more audio characteristics of the streaming media content;
playing, by the audio output component into an environment, the first portion of the streaming media content;
capturing, by an audio input component, a second digital signal representing the first portion of the streaming media content as played by the audio output component into the environment;
determining, based on the captured second digital signal, one or more detected audio characteristics of the streaming media content as played into the environment;
determining a difference between the one or more audio characteristics of the streaming media content and the one or more detected audio characteristics of the streaming media content;
calibrating a second portion of the streaming media content based on the difference and based on a determination that the second portion is to be calibrated, wherein the calibrating comprises applying the difference as an input to a machine learning model in order to determine an output audio setting; and
playing, by the audio output component to the environment, the second portion as calibrated.

29. An article of manufacture including a non-transitory computer-readable medium, having stored thereon program instructions that, upon execution by one or more processors of a computing device, cause the computing device to carry out operations comprising:
determining, during a dynamic audio calibration process and based on a first digital signal representing a first portion of streaming media content provided by a media playback application to an audio output component, one or more audio characteristics of the streaming media content;
playing, by the audio output component into an environment, the first portion of the streaming media content;
capturing, by an audio input component, a second digital signal representing the first portion of the streaming media content as played by the audio output component into the environment;
determining, based on the captured second digital signal, one or more detected audio characteristics of the streaming media content as played into the environment;
determining a difference between the one or more audio characteristics of the streaming media content and the one or more detected audio characteristics of the streaming media content;
calibrating a second portion of the streaming media content based on the difference and based on a determination that the second portion is to be calibrated, wherein the calibrating comprises applying the difference as an input to a machine learning model in order to determine an output audio setting; and
playing, by the audio output component to the environment, the second portion as calibrated.

30. The device of claim 1, the operations further comprising:
detecting a change from the first media playback application to a second media playback application; and
responsive to the detecting, calibrating a second streaming media content provided by the second media playback application.

* * * * *